United States Patent [19]
Kobayashi

[11] Patent Number: 5,821,825
[45] Date of Patent: Oct. 13, 1998

[54] OPTICALLY CONTROLLED OSCILLATOR

[75] Inventor: Kevin W. Kobayashi, Torrance, Calif.

[73] Assignee: TRW Inc., Redondo Beach, Calif.

[21] Appl. No.: 757,056

[22] Filed: Nov. 26, 1996

[51] Int. Cl.[6] .............................. H03B 5/00; H03B 19/00; H04B 1/28; H04B 10/06
[52] U.S. Cl. .......................... 331/66; 331/40; 331/108 C; 331/115; 331/117 R; 331/177 R; 331/181; 333/214; 359/191; 455/318; 455/333
[58] Field of Search ................................... 331/34, 40, 42, 331/43, 66, 108 R, 117 R, 117 FE, 108 C, 177 R, 181, 115, 132; 333/214; 359/162, 191; 455/255, 318, 333

[56] References Cited

U.S. PATENT DOCUMENTS

| | | | |
|---|---|---|---|
| 5,347,235 | 9/1994 | Higgins et al. | 331/66 |
| 5,623,233 | 4/1997 | Higgins et al. | 331/37 |

OTHER PUBLICATIONS

"Monolithic Microwave–Photonic Integrated Circuits: A Possible Follow–up to MIMIC" by Peter Herczfeld, *Microwave Journal,* Jan. 1992, pp. 64–78.

"Generation of Millimeter–Wave Radiation by Optical Mixing in FET's Integrated with Printed Circuit Antennas" by D.V. Plant, D.C. Scott, D.C. Ni, H.R. Fetterman, *IEEE Microwave and Guided Wave Letters,* vol. 1, No. 6, Jun. 1991, pp. 132–134.

"Single–Event Dynamics of High–Performance HBTs and GaAs MESFETs" by D.McMorrow, T. Weatherford, A.R. Knudson, L. Tran, J.S. Melinger and A.B. Campbell, *IEEE Transactions on Nuclear Science,* vol. 40, No. 6 pp. 1858–1866; Dec.–1993.

Optically Generated 60 GHz Millimeter Waves Using AlGaAs/InGaAs HEMT's Integrated with Both Quasi–Optical Antenna Circuits and MMIC's by D.V. Plant, D.C. Scott, H.R.Fetterman, L.K. Shaw, W.Jones, and K.L.Tan *IEEE Photonics Technology Letters,* vol. 4, No. 1, Jan. 1992, pp. 102–105.

"60 GHz Sources Using Optically Driven Heterojunction Bipolar Transistors" by: D.C. Scott, D.V. Plant, and H.R. Fetterman, *Applied Physics Letters,* vol. 61, No. 1, Jul. 1992, pp. 1–3.

"Optoelectronic Phase–Locking of Microwave Signals up to 18 GHz by a Laser–Diode–Based GaAs;Cr Photoconductive Harmonic Mixer" by H.Wu, C.Chang, and C.Pan, *IEEE Microwave and Guided Wave Letters,* vol. 2, No. 1, Jan. 1992, pp. 11–13.

"A Pulsed Microwave Oscillator Using Optically Controlled Active Feedback", by W.D.Jemison and P.R.Herczfeld, *IEEE Microwave and Guided Wave Letters,* vol. 2, No. 5, May 1992, pp. 177–179.

"A New Possibility of Detecting Lightwave Signals Through IMPATT Oscillators" by B.N. Biswas, A.K. Bhattacharya, T.C. Mukhopadhyay, and S. Chaudhury, *IEEE Journal on Selected areas in Communications,* vol. 8, No. 7, Sep. 1990, pp. 1387–1396.

"FM–FDM Optical CATV Transmission Experiment and System Design for MUSE HDTV Signals".

"Lossless, Broadband Monolithic Microwave Active Inductors", by S.Hara, T. Tokumitsu, and M. Aikawa, *IEEE MTT–S Digest* (1989), 11.955–958.

*Primary Examiner*—David Mis
*Attorney, Agent, or Firm*—Michael S. Yatsko

[57] ABSTRACT

An optically controlled oscillator utilizes a HEMT or a PIN diode as a photodetector and either a HEMT or HBT as an active inductor. The optically controlled HEMT active inductor provides a means for tuning the frequency of the oscillator. The optical receiver includes an optically tunable active inductor using a photodetector which includes a resonant tank circuit of an electronic oscillator to allow both optical/digital quench and unquench of an oscillator or digital AM detection with an improved signal to noise ratio, or optical FM modulation and analog AM detection by tuning/shifting the frequency of the oscillation through the detection of the optical light intensity.

16 Claims, 15 Drawing Sheets

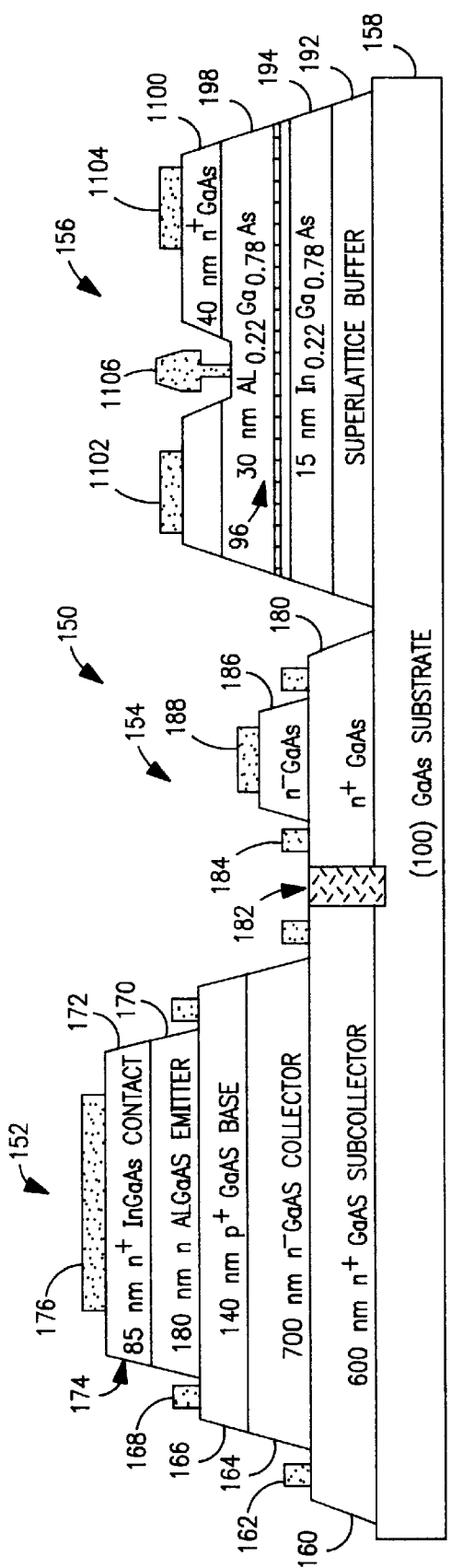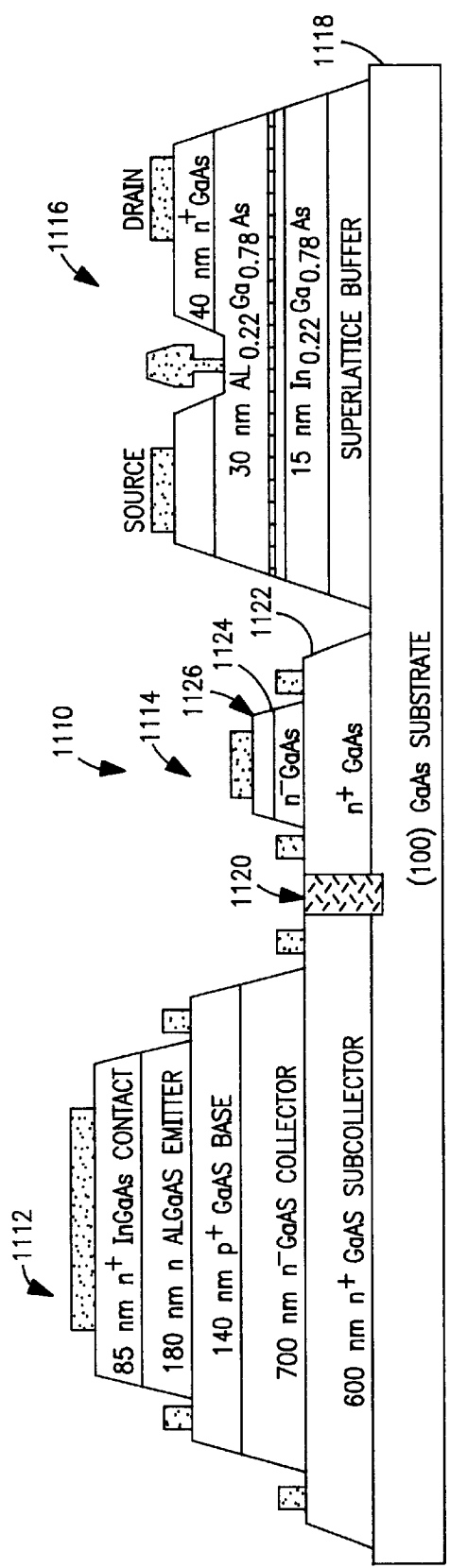
FIG. 11
FIG. 12

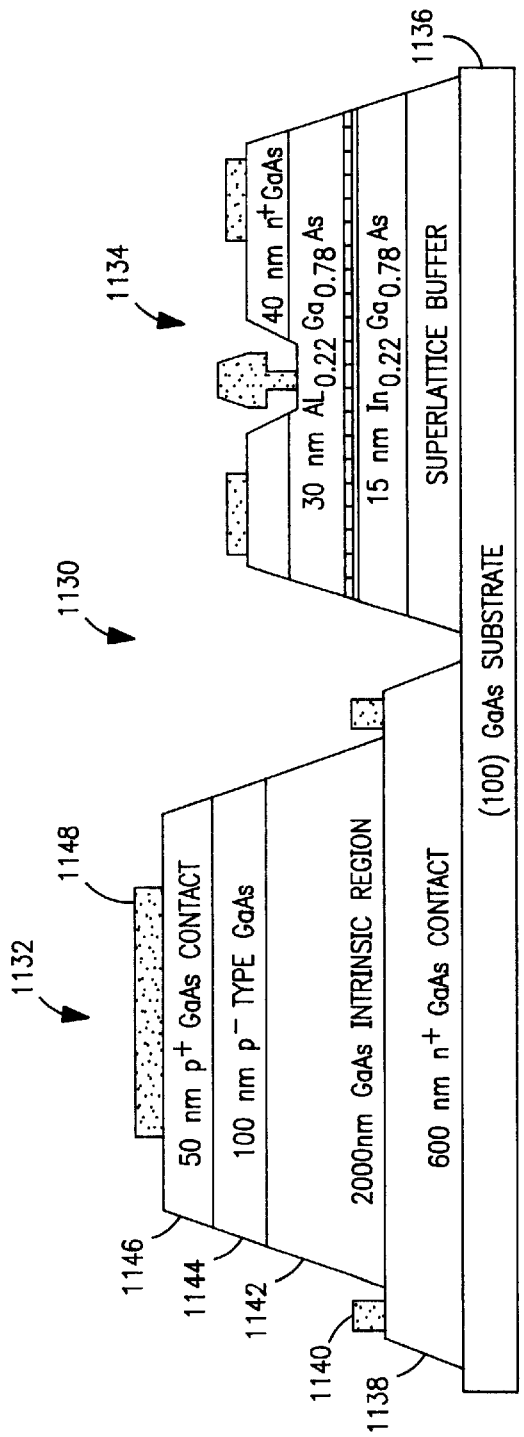
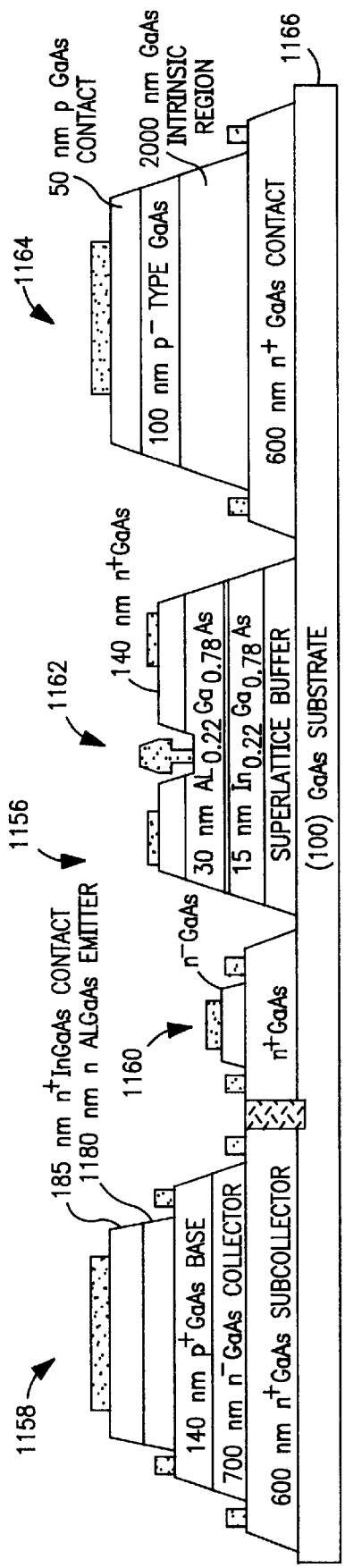
FIG. 13
FIG. 14

--- HEMT-HBT SELECTIVE MBE
—— HEMT ONLY

OPTICALLY CONTROLLED OSCILLATOR

BACKGROUND OF THE INVENTION

1. Field of the Invention

The present invention relates to an optically controlled oscillator and an optical receiver and, more particularly, to a tunable optically controlled oscillator and a tunable optical receiver that are adapted to be formed as optical-electronic integrated circuits (OEIC) from high electron mobility transistors (HEMT), heterojunction bipolar transistors (HBT) or a hybrid combination thereof, and in some embodiments include an integrated PIN diode.

2. Description of the Prior Art

Optical-electronic integrated circuits (OEIC) are becoming increasingly popular, due to their relatively smaller size, weight and immunity from electromagnetic interference relative to known monolithic microwave integrated circuits (MMIC). Several approaches are known to monolithically integrate optical and MMIC functions. One such example is disclosed in "Monolithic Microwave-Photonic Integrated Circuits: A Possible Follow-Up to MIMIC", by P. R. Herczfeld, *Microwave Journal,* Vol. 35, pp. 64–78, January 1992. Many known approaches are based upon integrating a PIN diode or MESFET, HEMT device photodetectors with relatively low noise, transimpedance amplifiers. Such a system is limited to AM detection, since usually digital AM data is being detected (i.e., on/off).) Other known photonic detection/reception devices are based upon modulating a MESFET/HEMT or HBT-active device with the beat frequency of two optically mixed signals. Examples of such devices are disclosed in "Generation of Millimeter-Wave Radiation by Optical Mixing in FET's Integrated and Printed Circuit Antennas", by D. V. Plant, D. C. Scott, D. C. Ni, and H. R. Fetterman, *IEEE Microwave and Guided Wave Letters,* Vol. 1, No. 6, pp. 132–134, June 1991; "Single Event Dynamics of High Performance HBT's and GaAs MESFET's", by D. McMorrow, T. Weatherford, A. R. Knudson, L. H. Tran, J. S. Melinger and A. B. Campbell, *IEEE Transactions on Nuclear Science,* Vol. 40, No. 6, pp. 1858–1866, December 1993; and "Optically Generated 60 GHz Millimeter Waves Using AlGaAs/InGaAs HEMT's Integrated with Both Quasi-Optical Antenna Circuits and MMIC's", by D. V. Plant, D. C. Scott, H. R. Fetterman, L. K. Shaw, W. Jones and K. L. Tan, *IEEE Photonics Technical Letters,* Vol. 4, No. 1, pp. 102–105, January 1992. However, such systems require relatively complex optical hardware external to the OEIC.

Other known devices and systems are based upon optical control of electronic oscillators through optical illumination of an integrated detection device, such as a GaAs:Cr photoconductive switch, HEMT, or IMPATT diode. Examples of such systems are disclosed in: "Opto-electronic Phase-Locking of Microwave Signals Up To 18 GHz by a Laser Diode-Based GaAs:Cr Photoconductive Harmonic Mixer", by H. H. Wu, C. S. Chang, and C. L. Pan, *IEEE Microwave and Guided Wave Letters, Vol. 2, No.* 1, pp. 11–13, January 1992; "A Pulsed Microwave Oscillator Using Optically Controlled Active Feedback", by W. D. Jemison and P. R. Herczfeld, *IEEE Microwave and Guided Wave Letters,* Vol. 2, No. 5, pp. 177–179, May 1992; and "A New Possibility of Detection Lightwave Signals Through IMPATT Oscillators", by B. N. Biswas, A. K. Bhattacharya; T. C. Mukhopadhyay and S. Chaudhury, *IEEE Selected Areas and Communications,* Vol. 8, No. 7, pp. 1387–1396, September 1990. Such systems provide for increased signal to noise ratio of the received signal, as well as providing a format for optically controlled FM modulation schemes. An article entitled "FM-FDM Optical CATV Transmission Experiment and System Design for MUSE HDTV Signals", by M. Maeda and M. Yamamoto, *IEEE Selected Areas and Communications,* Vol. 8, No. 7, pp. 1257–1267, September 1990, discloses a system for providing optical/digital FM modulation for use in FM based systems, such as FM-DFM CATV for satellite transmission of HDTV signals.

A pulsed microwave oscillator is also known, using an optically controlled MESFET active inductor, for example, as disclosed in "A Pulsed Microwave Oscillator Using Optically Controlled Active Feedback", by W. D. Jemison and P. R. Herczfeld, *IEEE Microwave and Guided Wave Letters,* Vol. 2, No. 5, pp. 177–179, May 1992;. As disclosed therein, an optically pulsed signal illuminates an active FET device and changes the effective inductance of the FET active inductor, which, in turn, is coupled to the gate of a FET oscillator. By applying an optical pulse, the steady state oscillation start-up condition can be induced or inhibited, resulting in the quenching (oscillation) or unquenching of the oscillator. Digital quench and unquench of the oscillator is achieved by DC biasing the active inductor at the threshold of the oscillator start-up condition and optically illuminating the active inductor to induce oscillation. Although such a system provides a fairly good signal to noise ratio with relatively quick rise and fall times, the system does not accommodate analog AM detection (light intensity) and does not offer a means of optical analog detection of various degrees of light intensity or a means of optical FM modulation.

SUMMARY OF THE INVENTION

It is an object of the present invention to provide an optical oscillator and optical receiver that solves various problems in the prior art.

It is yet another object of the present invention to provide an optical oscillator and optical receiver that is tunable.

It is yet another object of the present invention to provide an optical oscillator and optical receiver for optical analog detection of various degrees of light intensity.

Briefly, the present invention relates to an optically controlled oscillator which utilizes a high electron mobility transistor (HEMT) or a PIN diode as a photodetector and either a HEMT or heterojunction bipolar transistor (HBT) as an active inductor. The optically controlled active inductor provides a means for tuning the frequency of the oscillator. The optical receiver includes an optically tunable active inductor using a photodetector which, in turn, is included in a resonant tank circuit of an electronic oscillator to allow both optical digital quench/unquench of an oscillator or digital AM detection with an improved signal to noise ratio, or optical FM modulation and analog AM detection by tuning/shifting the frequency of the oscillation through the detection of the optical light intensity.

BRIEF DESCRIPTION OF THE DRAWING

These and other objects of the present invention will be readily understood with reference to the following specification and attached drawing, wherein:

FIG. 11 shows a side view of a monolithically integrated HBT-Schottky-diode-HEMT device that has been fabricated according to a method of the present invention;

FIG. 12 shows a side view of a monolithically integrated HBT-PIN diode-HEMT device that has been fabricated according to a method of the present invention;

FIG. 13 shows a side view of a monolithically integrated PIN diode-HEMT device that has been fabricated according to a method of the present invention;

FIG. 14 shows a side view of a monolithically integrated HBT-Schottky diode-HEMT-PIN diode device that has been fabricated by a method of the present invention;

DETAILED DESCRIPTION OF THE INVENTION

Figure 6:
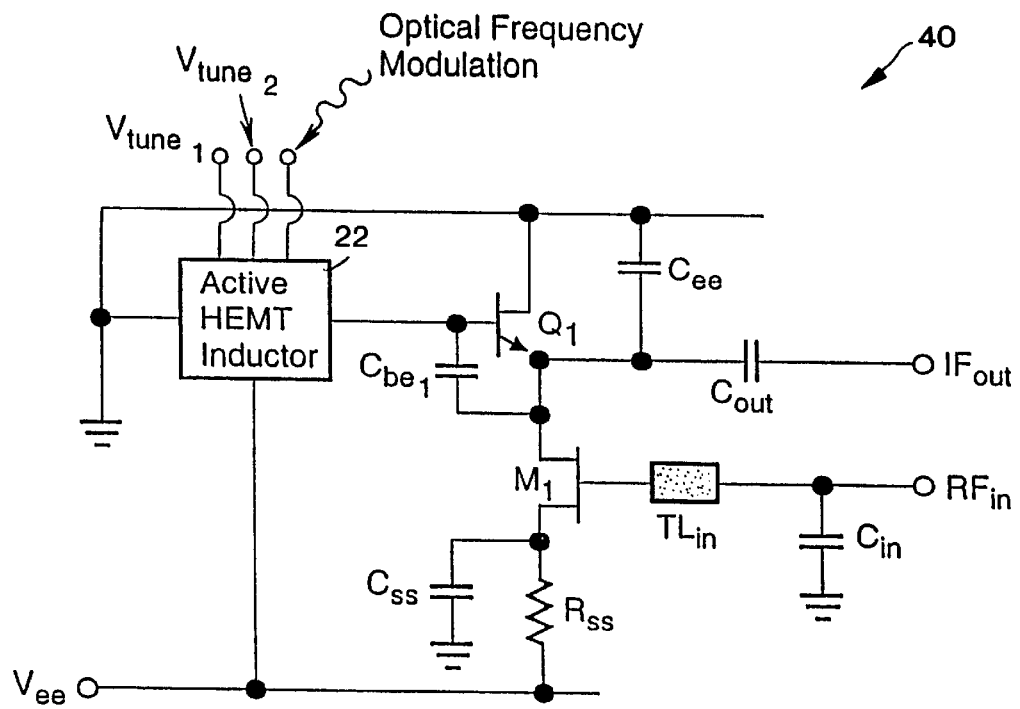
FIG. 6 is a simplified schematic diagram of a monolithic HEMT/HBT receiver in accordance with the present invention.
Figure 7:
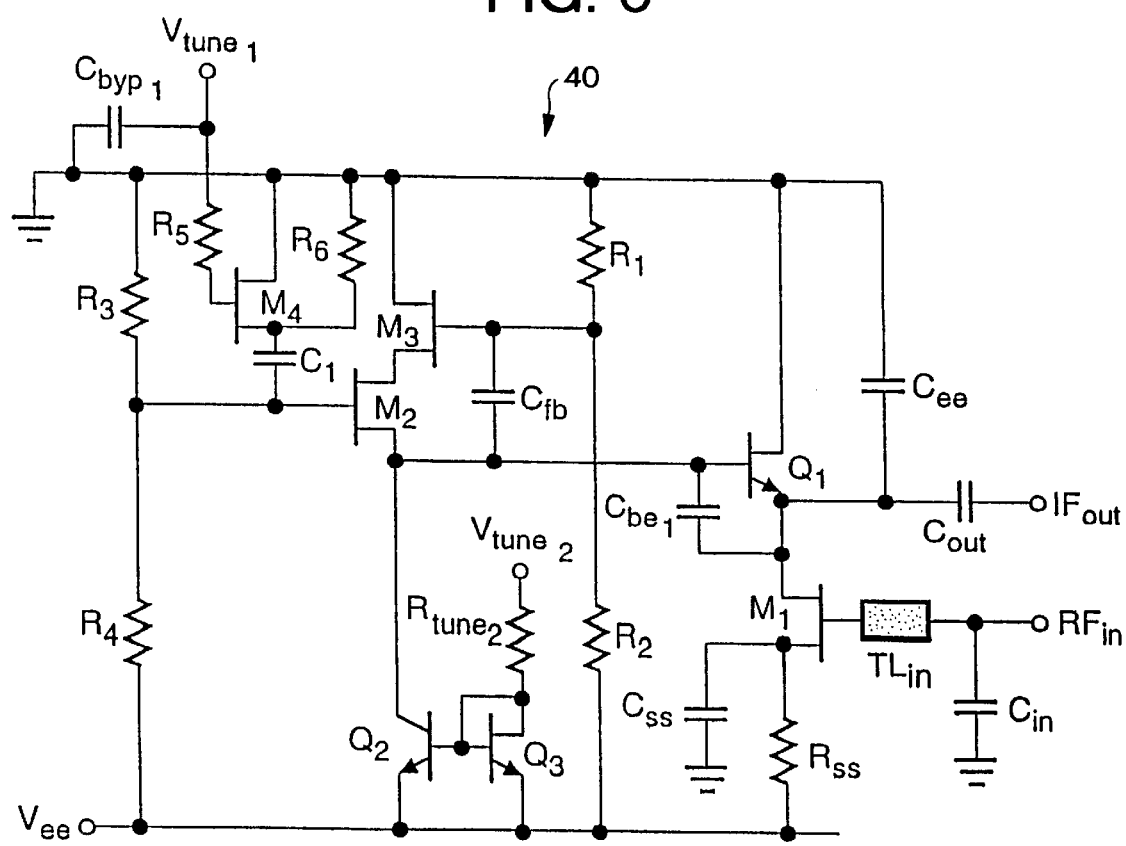
FIG. 7 is a schematic diagram of a monolithic integrated HEMT/HBT receiver which utilizes an HEMT/HBT optically controlled oscillator with a HEMT photodetector in accordance with the present invention.
Figure 8:
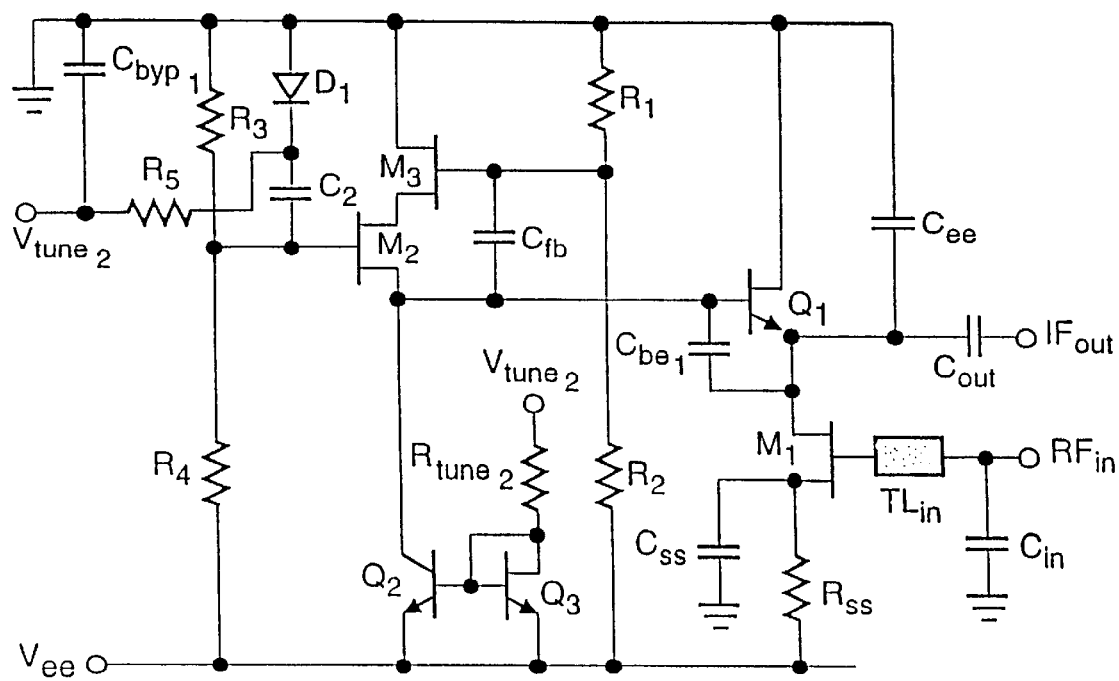
FIG. 8 is a schematic diagram of an alternative embodiment of a HEMT/HBT receiver in accordance with the present invention which integrates a HEMT/HBT receiver with a HEMT/HBT optically controlled oscillator which uses a PIN diode for a photodetector.

FIGS. 1–4 relate to optically controlled oscillators, while FIGS. 6–8 relate to optical receivers which incorporate the optically controlled oscillators illustrated in FIGS. 1–4. Both the optically controlled oscillators, as well as the optical receiver are adapted to be formed by monolithic integration of HEMTs, HBTs and PIN diodes, for example, as illustrated in FIGS. 9–26 and described below. An important aspect of the invention is that the monolithic integration of HEMTs, HBTs and PIN diodes provides for relatively high Q-factor active inductor, low phase noise oscillator and an efficient photodetector. The optically controlled oscillators, as well as the optical receivers, can also be formed from either HBTs or HEMTs or a hybrid combination of the two technologies for improved performance over known optical oscillators.

Figure 1:
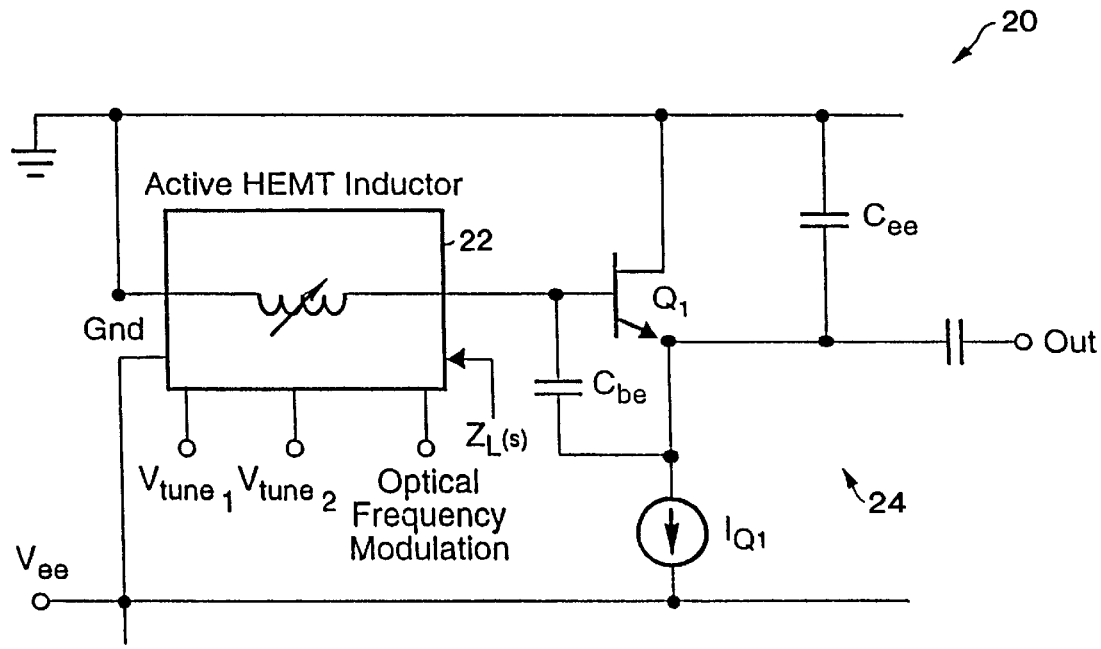
FIG. 1 is a simplified schematic of an optically controlled oscillator in accordance with the present invention which integrates a HEMT-active inductor with an HBT oscillator.

Referring to FIG. 1, a simplified schematic of an optically controlled oscillator is shown and generally identified with the reference numeral 20. The optically controlled oscillator 20 includes a relatively high Q-factor HEMT inductor 22 with a relatively low phase noise HBT oscillator 24. The HBT oscillator 24 is formed from a common collector HBT $Q_1$, a bias current source $I_{Q1}$ for biasing the transistor $Q_1$ and can be formed of either a resistor or simple current mirror, and an output coupling capacitor $C_{OUT}$, connected between the emitter of the HBT $Q_1$ and the output terminal OUT. The collector terminal of the HBT $Q_1$ is connected to ground. An emitter shunt capacitor $C_{EE}$, connected between the emitter and collector terminal of the HBT $Q_1$, is used to induce a negative resistance at the base of the HBT $Q_1$. A capacitor $C_{be1}$ is coupled across the base emitter junction of the HBT $Q_1$ in order to inhibit AM-PM noise injection from the $V_{EE}$ DC supply. The base of the HBT $Q_1$ is loaded with an active inductor tank circuit formed, as a three-terminal device, preferably from a HEMT or FET device. The HEMT offers a higher Q-factor active inductor characteristic, while the HBT offers low 1/f device phase noise characteristics resulting in relatively low oscillator phase noise.

The active inductor 22 is provided with two DC tuning ports, $V_{TUNE1}$ and $V_{TUNE2}$, one of which can be used to change the quiescent bias current of the active inductor, while the other is used in conjunction with adjusting the bias of the photodetector, for example, a HEMT (FET) or PIN diode photodetector. Both of the DC tuning ports $V_{TUNE1}$ and $V_{TUNE2}$ are adjusted or modulated electronically to change the active inductor value in order to change the oscillation frequency. The active inductor 22 is also shown with a third port for optical frequency modulation, which is a non-physical port symbolizing the illumination or optical excitation of the photodetector device which modulates the active inductance value and the corresponding oscillation frequencies set by the resonant active inductor tank circuit.

The oscillation frequency of the circuit 20 is set by the external tuning capacitors $C_{EE}$ and $C_{BE}$, the intrinsic device base emitter capacitance $C_\pi$ and the active inductor 22, identified below as $L_{ACTIVE}$. The oscillation frequency of the circuit 20 is provided by the following equations:

$$f_{osc} = \frac{1}{2\pi \sqrt{C_{eff} \cdot L_{active}}} \tag{1}$$

where $$C_{eff} = \frac{(C_{be} + C_\pi) C_{ee}}{C_{be}} + C_\pi + C_{ee} \tag{2}$$

and $$C_\pi = C_{TE} + G_{m1} \cdot \tau_{F1} \tag{3}$$

where $C_{TE}$ is the base-emitter transition or depletion capacitance of the HBT, $Q_1$, $G_{M1}$ is the dc transconductance of the HBT $Q_1$, and $\tau_{F1}$ is the forward transport time through the HBT Q1.

Figure 2:
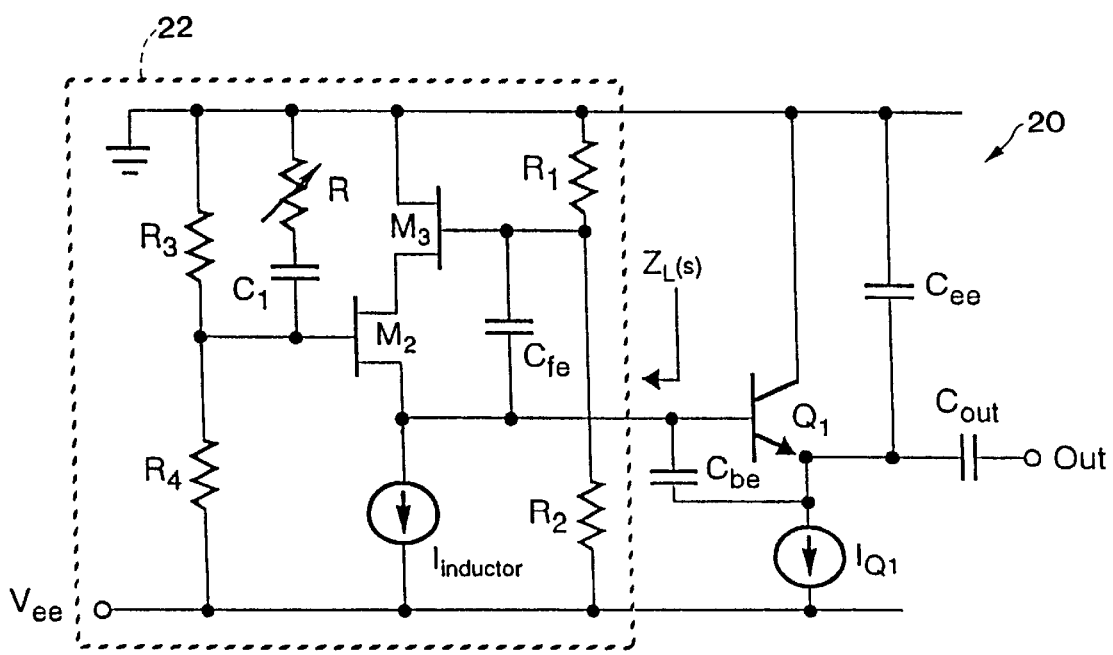
FIG. 2 is a detailed schematic diagram of the HEMT inductor integrated with the HBT oscillator illustrated in FIG. 1.

FIG. 2 is a relatively more detailed schematic of an optically controlled oscillator. In this embodiment, the active inductor is formed from cascode-connected HEMTs M2 and M3, a feedback capacitor $C_{FE}$ and a shunt RC network formed from a capacitor $C_1$ and a variable resistor R. A DC bias voltage terminal port and a non-physical optical input port are provided, as indicated in the block diagram illustrated in FIG. 1.

The detector element is represented by a variable resistor to symbolize the actual function to the overall oscillator circuit. The variable resistor R represents the impedance of the photodetector element formed from either a PIN diode or a HEMT. Optical illumination or dc bias modulation of the photodetector changes the effective resistance of the photodetector, resulting in a change in the effective active inductance and a corresponding change in the frequency of oscillation.

A current source bias represented by $I_{INDUCTOR}$ is also formed with a controlled adjustment for setting the bias current of the active inductor. The resistors $R_1$, $R_2$, $R_3$ and $R_4$ provide voltage dividers for biasing the gates of the cascode-connected HEMT transistors $M_2$ and $M_3$.

As disclosed in "Lossless, Broadband Monolithic Microwave Active Inductors", by S. Hara, T. Tokumitsu, and M. Aikawa, *IEEE MTT-S Digest*, pp. 955–958, 1989, hereby incorporated by reference, the complex impedance of the active inductor is provided by the following equation:

$$Z_{\substack{active \\ inductor}} = \frac{1}{Gm_{HEMT}} + j\frac{\omega C_{gs} \cdot R}{Gm_{HEMT}} \tag{4}$$

where $Gm_{HEMT}$ is the transconductance of the HEMT devices $M_Z$ and $M_3$, which are assumed to be the same size, and $C_{gs}$ is the gate-to-source capacitance of the HEMT.

As can be seen from Equation 4, changing the value of R, the effective real impedance of the photodetector will proportionately change the effective inductance of the active inductor. The effective photodetector, whether a PIN diode or HEMT device, can be changed electronically by adjusting the DC bias or by optically illuminating the detector device.

Additional electronic tuning can be achieved by changing the active inductor bias current $I_{INDUCTOR}$ using a voltage adjustment of a voltage control current source to provide both optical and electronic control of the HBT oscillator.

Figure 3:
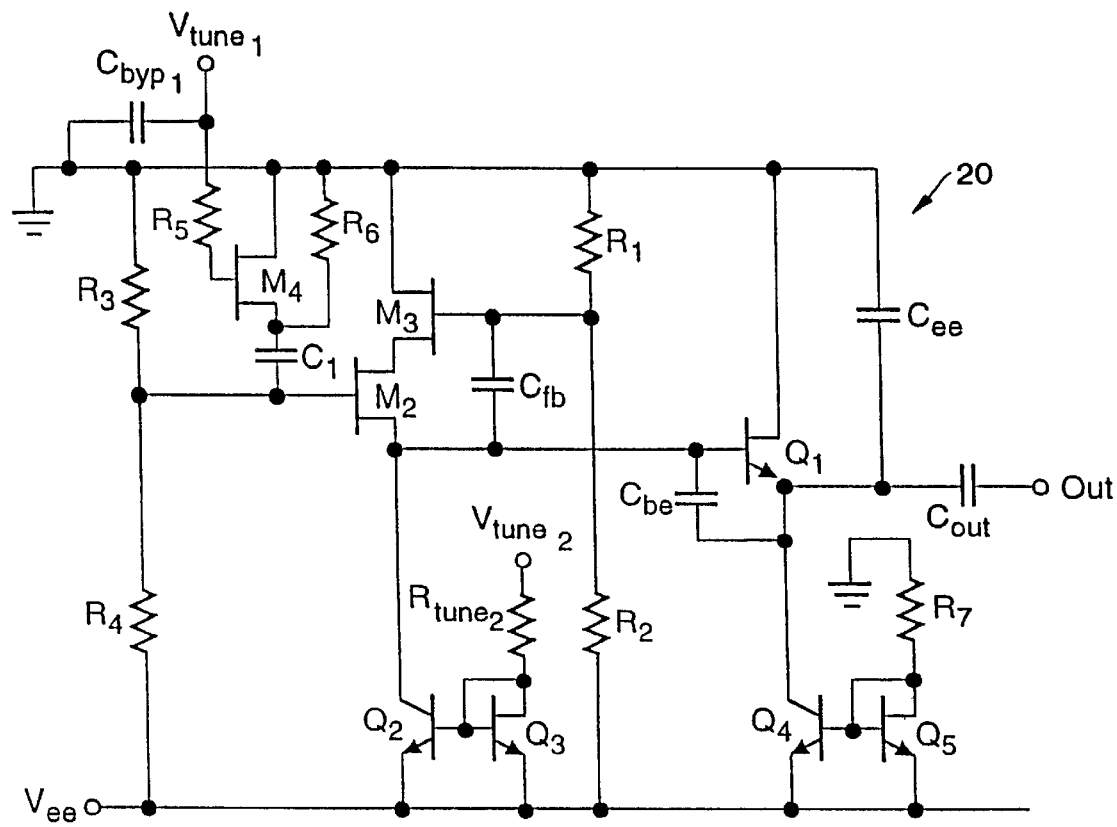
FIG. 3 is a schematic diagram of a HEMT/HBT oscillator with a HEMT device as the photodetector/variable resistor.

FIG. 3 is an alternate embodiment of the optically controlled oscillator which utilizes a HEMT as a photodetector/variable resistor. The embodiment illustrated in FIG. 3 is similar to FIG. 2, except that the variable resistor R is replaced with a HEMT M4, biasing resistors $R_5$ and $R_6$, a bypass capacitor $C_{BYP1}$ and a DC tuning voltage port $V_{TUNE1}$ for DC or RF modulation of the HEMT channel resistance. The voltage controlled current source $I_{INDUCTOR}$ in FIG. 2 is formed from a current mirror which includes the transistors Q2 and Q3, a resistor $R_{tune1}$ and a tuning voltage port $V_{TUNE2}$. The fixed current source $I_{Q1}$ is substituted with a current mirror which includes the transistors Q4, Q7 and the resistor $R_7$. In this case, the complex impedance of the active HEMT inductor device is provided by Equation 5 below:

$$Z_{\substack{active \\ inductor}} = \frac{1}{Gm_{HEMT}} + j\omega C_{gs} \cdot \frac{\frac{1}{Gmd(I)}}{Gm_{HEMT}} \tag{5}$$

where $Gm_{HEMT}$ is the conductance of the HEMTs M2 and M3, $C_{GS}$ is the gate-to-source capacitance of the HEMTs M2 and M3, and Gmd(I) is the light intensity (I) dependent transconductance of the HEMT photo-detector M4.

As can be seen from Equation 5, the impedance is a function of light intensity I.

Figure 4:
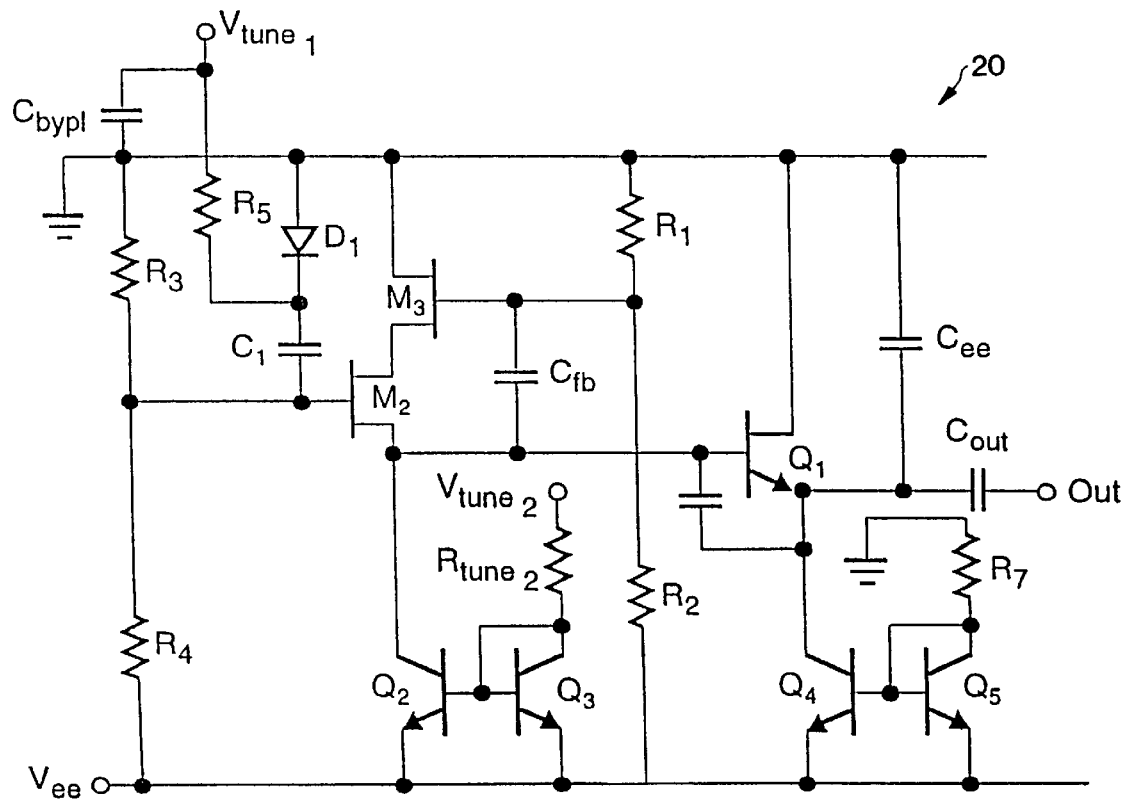
FIG. 4 is a schematic diagram of an alternate embodiment of the EMT/HBT oscillator with a PIN diode device as the phodetector/variable resistor.

Another alternate embodiment of the optically controlled oscillator is illustrated in FIG. 4. In this embodiment, the photodetector/variable resistor illustrated in FIG. 2, is implemented as a PIN diode photodetector. In particular, the photodetector is formed from a PIN diode $D_1$, a bias resistor $R_5$, a bypass capacitor $C_{BYP1}$ and a DC tuning voltage port $V_{TUNE1}$. The complex impedance of the inductor for the circuit illustrated in FIG. 4 is given by Equation 6 below:

$$Z_{\substack{active \\ inductor}} = \frac{1}{Gm_{HEMT}} + j\frac{\omega C_{gs} \cdot \frac{1}{Gms(I)}}{Gm_{HEMT}} \tag{6}$$

where I represents light intensity.

Figure 5:
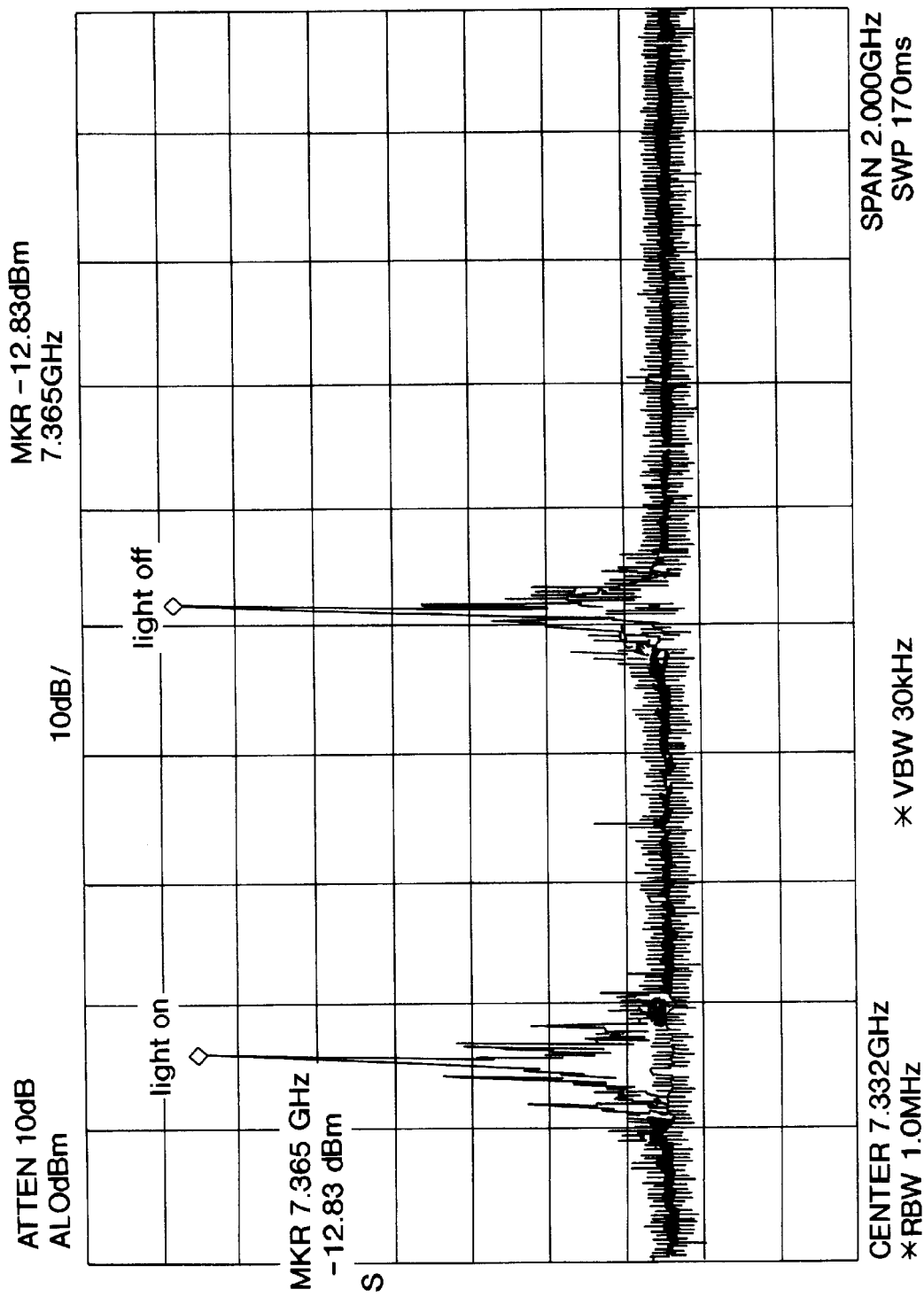
FIG. 5 is a graphical illustration of the optical response of a GaAs HEMT/HBT monolithic oscillator which utilizes a HEMT device as a photodetector.

FIG. 5 represents the optical response of a gallium arsenide (GaAs) HEMT/HBT monolithic optical oscillator which utilizes a gallium arsenide (GaAs) HEMT device as a photodetector. As shown in FIG. 5, an approximate ten percent (10%) decrease in the frequency of oscillation from 365 GHz to 6.638 GHz due to the illumination of the HEMT device, for example, with a 630–670 nm laser pointer with an output power less than 5 milliwatts. This frequency change corresponds to the maximum frequency change when the DC gate voltage of the HEMT detector device is swept from one extreme to the other without optical illumination.

FIGS. 6–8 illustrate a monolithically integrated optical receiver. In particular, the receiver as illustrated in FIGS. 6–8, can be utilized for processing the FM signal generated from the optically controlled oscillators illustrated in FIGS. 1–4. A simplified schematic of an optically integrated oscillator is illustrated in FIG. 6. The receiver, generally identified with the reference numeral 40, includes an HBT oscillator transistor $Q_1$, with a corresponding output coupling capacitor $C_{OUT}$ and tuning capacitors $C_{BE1}$ and $C_{EE}$. An active HEMT inductor, represented by the block 22, is provided with three (3) input ports, as discussed above, in connection with FIG. 1. An input port $V_{TUNE1}$ provides for DC bias adjustment of the photodetector element, for example, a PIN diode or HEMT device. A second input port $V_{TUNE2}$ provides for DC bias adjustment of the quiescent bias current of the active inductor $I_{INDUCTOR}$. A non-physical optical frequency modulation port represents the input of the optical signal to the detector element. A common source HEMT $M_1$ with an HBT oscillator transistor forms a cascode device to provide a relatively low noise, high linearity means for frequency converting the optically modulated oscillation signal. A resistor $R_{SS}$ provides for self-biasing of the HEMT device while a capacitor $C_S$ provides an AC path to ground from the source of the HEMT $M_1$. A transmission line $TL_{in}$ and a shunt capacitor $C_{in}$ form a low pass network for tuning the RF input port of the receiver. As the optically modulated oscillator signal is generated, an RF input signal can be used to frequency convert the optically modulated signal for further filtering and signal processing.

FIGS. 7 and 8 also represent optical receivers based on the oscillators illustrated in FIGS. 3 and 4, respectively, as discussed above. For example, FIG. 7 includes an HEMT/HBT optically controlled oscillator with a HEMT photodetector. FIG. 8 illustrates an HEMT/HBT optically controlled oscillator with a PIN diode photodetector.

The topologies disclosed for the optically controlled oscillator and the receivers take advantage of the low phase noise characteristics of the HBT oscillators and the high Q-factor of the active HEMT inductors, as well, in some embodiments of the efficient optical electronic detection and conversion of PIN diodes. The invention provides several advantages, including providing a means of optically controlling microwave oscillation frequency by illuminating a HEMT or PIN diode integrated with a high Q-factor HEMT active inductor which forms a tank resonator circuit of a relatively low phase noise HBT oscillator. In addition, as illustrated by Equations 5 and 6, the embodiments illustrated in FIGS. 3 and 4 provide for optical/digital analog FM modulation, in particular, in such circuits, various degrees of optical light intensity induces shifts in the optical frequencies, with a maximum digital FM bandwidth, for example, as high as ten percent (10%). The shift in optical frequency due to light intensity is analog in nature, but can be operated using a digital/optical excitation. Moreover, digital/optical AM modulation and/or detection can be achieved by biasing the active HEMT inductor such that the oscillation is either quenched or unquenched, induced by the presence or absence of an optical signal.

MONOLITHIC MULTIFUNCTION INTEGRATED CIRCUIT DEVICES

The following discussion of the preferred embodiments concerning methods of generating monolithically integrated circuit devices, and the resulting integrated circuits, is merely exemplary in nature and is in no way intended to limit the invention or its applications or uses.

First turning to FIGS. 9 (a)–9(d), a series of side views of a monolithically integrated semiconductor structure 110 is shown as the structure 110 is being fabricated by steps in accordance with forming a monolithically integrated circuit device by a preferred embodiment of the present invention. The method of fabricating the structure 110 is applicable to form many monolithically integrated devices including, but not limited to, monolithically integrated HEMT-HBT, HEMT-PIN diode, MESFET-HBT or MESFET-PIN diode devices. Monolithically integrated devices fabricated by the process as will be discussed are formed on a common substrate 112. In the embodiment shown, the substrate 112 is either gallium arsenide (GaAs) or indium phosphide (InP), however, other substrates may be applicable. The process for fabricating the different semiconductor layers is performed by a selective molecular beam epitaxy (MBE) process, well understood by those skilled in the art.

Figure 9A:
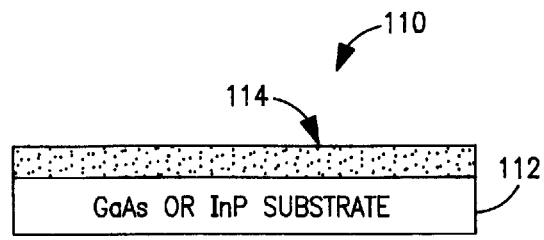
FIGS. 9(a)–9(d) show side views of a developing structure for fabricating an HEMT-HBT, HEMT-PIN diode, MESFET-HBT, or MESFET-PIN diode integrated circuit device according to a preferred embodiment of the present invention.

An HBT profile layer 114 is first grown on the substrate 112 by the MBE process as shown in FIG. 9(a). The HBT profile layer 114 is grown when fabricating an integrated HEMT-HBT or MESFET-HBT device. When fabricating an HEMT-diode or MESFET diode device, the profile layer 114 would be a diode profile layer. The profile layer 114 would include all of those semiconductor layers that make up an HBT or diode device. The diode profile could be any applicable diode profile, including, but not limited to, PIN diodes, schottky diodes, triodes, etc. After the layer 114 has been grown, a silicon nitride (Si3N4) layer is deposited on the structure 110 by, for example, a plasma enhanced chemical vapor deposition process, well understood to those skilled in the art. It is noted that silicon nitride is used by way of a non-limiting example as other dielectric layers, such as silicon dioxide, may be equally applicable. The silicon nitride layer 116 will be used as a blocking layer to shield the HBT device from the growth of HEMT or MESFET profile layers that are to be fabricated, as will become apparent from the discussion below.

After the silicon nitride layer 116 has been deposited on the profile layer 114, a resist layer (not shown) is then deposited on the silicon nitride layer 116. A mask (not shown) is then used to pattern the resist layer, and thus the silicon nitride layer 116, into a pattern that will define either the diode device or the HBT device. The resist layer is exposed to radiation through the mask, and then is developed by an appropriate solvent such that the unmasked portions of the resist layer are dissolved and removed. An etchant solution is then applied to the exposed portions of the silicon nitride layer 116 to remove the silicon nitride in the areas which coincide with the removed regions of the resist layer in order to expose the profile layer 114 at these regions. The exposed regions of the profile layer 114 are then etched by an appropriate anisotropic etchant to expose the substrate 112.

Figure 9B:
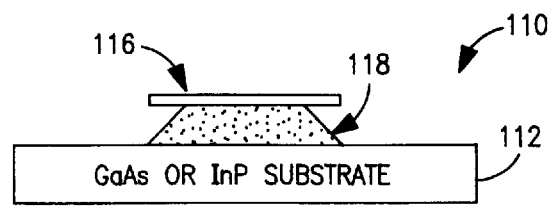

FIG. 9(b) shows the structure 110 after the exposed regions of the layer 114 have been etched away. The remaining profile layer 114 defines an HBT device layer 118, as shown. A portion of the silicon nitride layer 116 remains over the device layer 118. The anisotropic etching step produces a retrograde profile that causes overhang areas of the remaining silicon nitride layer 116 to extend beyond a top surface of the device layer 118. This provides a clean separation between the device layer 118 and subsequent device profile layers, as will become apparent from the discussion below. The structure 110 is then removed from the MBE chamber (not shown), cleaned, and then reintroduced into the MBE system. The remaining silicon nitride layer 116 is densified during the normal de-gas in the MBE chamber as is well understood to those skilled in the art.

Figure 9C:
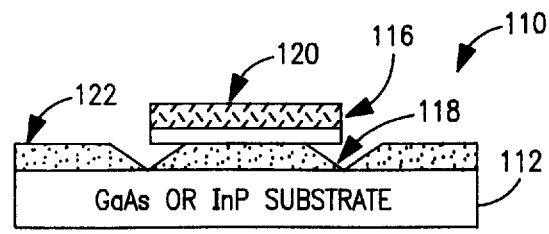
Figure 9D:
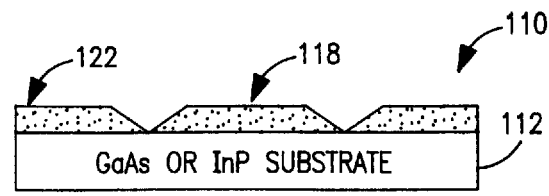

A pseudomorphic InGaAs-GaAs HEMT profile is then grown over the structure 110 by a known HEMT MBE growth procedure. It is also within the scope of the present invention to grow an MESFET profile at this place in the processing of the structure 110 instead of the HEMT profile. As shown in FIG. 9(c), the HEMT material that is deposited on the remaining silicon nitride layer 116 forms a polycrystalline HEMT profile layer 120 because the HEMT material is not lattice matched with the silicon nitride layer 116. The HEMT material that is deposited on the cleaned substrate 112 forms a single crystalline HEMT profile layer 122 because the HEMT material is lattice matched to the cleaned surface of the substrate 112. The single crystalline profile layer 122 forms the HEMT device. The polycrystalline HEMT layer 120 is removed by a wet etch process and the remaining silicon nitride layer 116 is removed using a dry etch process, both known processes in the art. Portions of the single crystalline HEMT profile layer 122 can be removed by an appropriate masking and etching step so as to further define the device geometry of the HEMT device. The monolithically integrated structure 110, as shown in FIG. 9(d), is then ready for device and circuit processing.

By the above process, the prior art HBT beryllium base dopant interstitial diffusion procedure associated with non-optimized MBE growth has been eliminated. This results in P-type profiles robust enough to withstand the additional temperature cycling associated with the HEMT growth, and is one key to the success of this selective MBE technique. In order for the HBT or diode profile to survive the HEMT temperature cycle during formation of the HEMT device, not only must the base layer of the HBT be stable, but also other layers in the HBT or diode profile must be stable. This includes an n=2×1019 contact layer and an n=5×1017 cm−3 Al0.3Ga0.7As emitter layer.

Figure 10A:
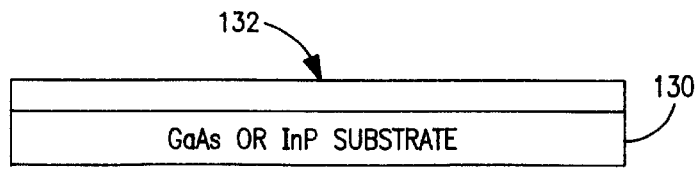
FIGS. 10(a)–10(g) show side views of a developing structure for fabricating an HEMT-HBT-PIN diode or MESFET-HBT-PIN diode integrated circuit device according to a preferred embodiment of the present invention.
Figure 10B:
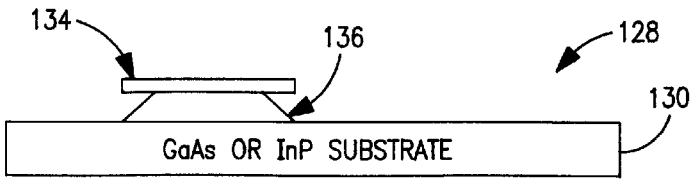
Figure 10C:
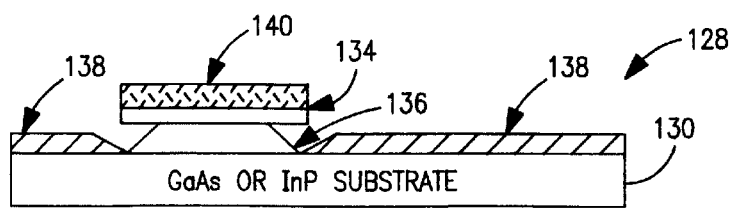
Figure 10D:
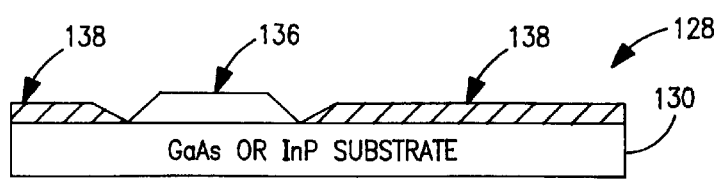

The techniques discussed above with reference to FIGS. 9(a)–9(d) can be extended to a process for forming other multiple monolithic integrated devices. For example, FIGS. 10(a)–10(g) show sequential fabrication steps of a monolithically integrated semiconductor structure 128 that generates a monolithically integrated HEMT-HBT-diode device. The device is formed on a GaAs or InP substrate 130, as with the structure 110 above. As shown in FIG. 10(a), a diode profile layer 132 is grown on the substrate 130. A first silicon nitride layer 134 is deposited, masked and etched, in the manner as discussed above, to form a diode device layer 136 as shown in FIG. 10(b). A remaining portion of the silicon nitride layer 134 covers the device layer 136. Note that overhang areas of the silicon nitride layer 134 extend beyond the device layer 136 as a result of the retrograde profile produced by the anisotropic etch that formed the device layer 136. An HBT profile is then grown over the structure 128 such that HBT material deposited on the substrate 130 forms a single crystalline HBT profile layer 138, and HBT material deposited on the remaining silicon nitride layer 134 forms a polycrystalline HBT profile layer 148, as shown in FIG. 10(c). FIG. 10(d) shows the developing structure 128 after the silicon nitride layer 134 and the polycrystalline HBT profile layer 140 have been dissolved by an appropriate wet etch and dry etch, respectively.

Figure 10E:
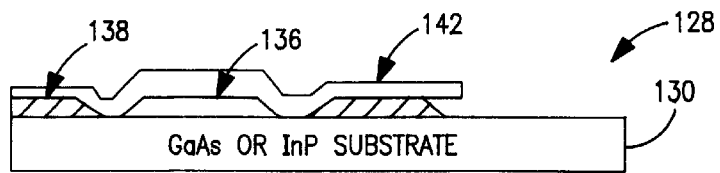
Figure 10F:
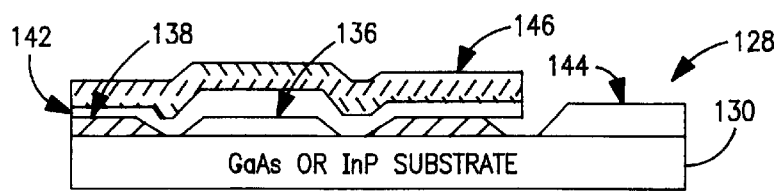
Figure 10G:
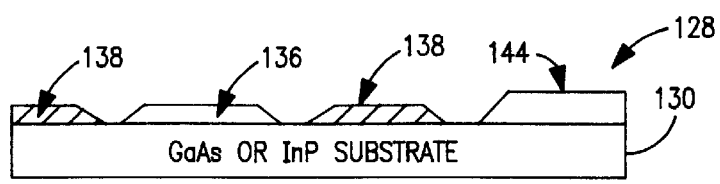

A second silicon nitride layer 142 is then deposited over the structure 128. The silicon nitride layer 142 is then patterned and etched by an appropriate resist layer and mask layer (not shown), in the manner as discussed above, to expose a region on the substrate 130 that will accept an HEMT profile, as shown in FIG. 10(e). HEMT material is then grown by the selective MBE process on the structure 128 such that a single crystalline HEMT layer 144 is deposited on the substrate 130, and a polycrystalline HEMT layer 146 is deposited on the remaining second silicon nitride layer 142, as shown in FIG. 10(f). As with the process with reference to FIGS. 9(a)–9(d), it is within the scope of the present invention to deposit an MESFET profile instead of the HEMT profile. An appropriate wet etch and dry etch selectively remove the polycrystalline layer 146 and the remaining silicon nitride layer 142, respectively, to expose and define an integrated HEMT-HBT-diode device, as shown in FIG. 10(g).

FIGS. 9(a)–9(d) show the processing steps necessary to fabricate dual monolithically integrated devices in which the first deposited device was robust enough to withstand the temperature cycling involved with fabricating the second deposited device, taking into consideration that the second deposited device is protected by the silicon nitride layer 116. FIGS. 10(a)–10(g) show the processing steps for fabricating three monolithically integrated devices in which the first deposited device is robust enough to withstand the temperature cycling involved with fabricating the second and third deposited devices, and the second deposited device is robust enough to withstand the temperature cycling involved with fabricating the third deposited device, taking into consideration that the second and third deposited devices are protected by the silicon nitride layer 142. This process can be extended to other semiconductor devices that satisfy this criteria, including extending the process to more than three monolithically integrated devices. For example, the process can be extended to fabricating a monolithically integrated HBT-diode device. The above-described process with reference to FIG. 10 can also be extended to a monolithically integrated MESFET-HBT-diode device where an MESFET profile is grown instead of the HEMT profile. Further, after the fabrication steps involved in the selective molecular epitaxy process that forms the device profiles as shown in FIGS. 9(d) and 10(g), other fabrication steps, known in the art, can be incorporated to provide other device types. For example, an ion implantation isolation step can be performed to separate portions of the collector layers of the HBT device to form diodes, such as Schottky diodes and PIN diodes. Also, other devices can be deposited such as a superconducting-insulator-superconducting detector after the selective molecular beam epitaxy steps.

FIGS. 11–16 show profile side views of six different monolithically integrated circuit devices after final device and circuit processing steps that could be fabricated by the selective MBE process according to the invention as discussed above. It will be understood that the different device layers and profiles discussed below for specific devices is merely by way of a non-limiting example in that the device profiles for a particular device could be any applicable profile for that device that is known in the art. Because the different device layers and contacts are known in the art, the description given below for these layers is merely cursory. It is also noted that because the various devices have been formed by molecular beam epitaxy, the bottom layer of each device forms an epitaxial bond with the substrate.

FIG. 11 shows a monolithically integrated device 150 including an HBT 152, a THz Schottky diode 154, and an HEMT 156 that could have been fabricated by the process as discussed above with reference to FIG. 9. Each of the different layers of the HBT 152, the Schottky diode 154 and the HEMT 156, are shown. As mentioned above, the HBT device layer 118 would include all of the layers of the HBT 152, and the HEMT profile layer 122 would include all of the layers of the HEMT 156. However, the HBT 152 has been further defined and processed more than the device layer 118, and the HEMT 156 has been further defined and processed more than the profile layer 122. The substrate 130 is shown as a GaAs substrate 158.

The HBT 152 includes a heavily doped n-type GaAs subcollector layer 160 grown on the substrate 158 to a thickness of about 600 nm. Two ohmic collector contacts 162 are deposited and defined on the subcollector layer 160. A lightly doped n-type GaAs collector layer 164 is grown on the subcollector layer 160 to a thickness of about 700 nm. A heavily doped p-type GaAs base layer 166 is grown on the collector layer 164 to a thickness of about 140 nm. An ohmic base contact 168 is deposited and defined on the base layer 166. An n-type AlGaAs emitter layer 170 is grown on the base layer 166 to a thickness of about 180 nm. A heavily doped n-type InGaAs emitter contact layer 172 is grown on the emitter layer 170 to a thickness of about 85 nm. The combination of the emitter layer 170 and the emitter contact layer 172 form an emitter mesa 174. An ohmic emitter contact 176 is deposited and defined on the emitter contact layer 172. The different processing steps that generate each of the contacts and the collector, base and emitter mesas of the HBT 152 as shown in FIG. 11 are well understood in the art.

The layers that make up the Schottky diode 154 are deposited simultaneously with the collector layers 160 and 164 of the HBT 152 and the diode 154 is subsequently separated from the HBT 152. Particularly, a heavily doped n-type GaAs diode layer 180 of the diode 154 is grown at the same time the subcollector layer 160 of the HBT 152 is grown so that the layer 180 and the subcollector layer 160 have the same thickness and composition. The subcollector layer 160 and the diode layer 180 are separated by an implant isolation region 182 formed by an ion implantation step of a suitable ion, such as oxygen, well known to those skilled in the art. A set of ohmic contacts 184 are deposited and defined on the diode layer 180. A lightly doped n-type GaAs diode layer 186 is formed on the diode layer 180. The diode layer 186 is formed simultaneously with the collector layer 164 of the HBT 152, and as such, is the same thickness and composition as the layer 164. A top ohmic contact 188 is deposited and defined on the diode layer 186. The diode layer 186 is separated from the collector layer 164 and defined by any suitable patterning process well known to those skilled in the art. Separation of the Schottky diode 154 from the collector layers of the HBT 152 provide a convenient way of providing another monolithically integrated device after the molecular beam epitaxy steps that is useful for certain applications. Etching steps are used to remove the profile layers that would have been above the diode layers 180 and 186 after the MBE steps.

The HEMT 156 has the different device layers as the HEMT profile layer 122 of FIG. 9. Particularly, the HEMT 156 includes a superlattice buffer layer 192 grown on the substrate 152. An In0.22Ga0.78As channel layer 194 is grown on the superlattice buffer layer 192 to a thickness of about 15 nm. A silicon planar doped layer 196 is deposited on the channel layer 194 to define the channel layer 194, as is well understood in the art. An Al0.22Ga0.78As donor layer 198 is grown on the planar doped layer 196 to a thickness of about 30 nm. A heavily doped n-type GaAs contact layer 1100 is grown on the donor layer 198 to a thickness of about 40 nm. A source terminal 1102 and a drain terminal 1104 are deposited and defined by an electron beam lithography process on the contact layer 1100 as shown. The contact layer 1100 is etched to expose the donor layer 198, and a T-gate drain terminal 1106 is deposited and etched on the donor layer 198 as shown. As discussed above, it is within the scope of the invention to replace the HEMT 156 with an MESFET.

FIG. 12 shows a side profile view of a monolithically integrated device 1110 that could also have been fabricated by the process as discussed above with reference to FIG. 9. The integrated device 1110 includes an HBT 1112, a PIN diode 1114 and an HEMT 1116 formed on a common substrate 1118. The HBT 1112 is the same as the HBT 152 and the HEMT 1116 is the same as the HEMT 1156, discussed above, and thus, the different layers of the HBT 1112 and the HEMT 1116 will not be discussed. As above, the HEMT 1116 could have been replaced with an MESFET.

The PIN diode 1114 is isolated from the HBT 1112 by an implant isolation region 1120 in the same manner that the Schottky diode 154 was isolated from the HBT 152 above. The PIN diode 1114 includes a heavily doped n-type GaAs diode layer 1122 and a lightly doped n-type GaAs diode layer 1124 that were grown at the same time as the subcollector layer and the collector layer of the HET 1112, respectively, and therefore have the same thickness and composition as these layers. The layer 1124 acts as the intrinsic layer in the PIN structure. A heavily doped p-type GaAs layer 1126 is grown on the lightly doped n-type GaAs layer 1124 to provide the PIN diode structure. The layer 1126 was grown at the same time as the base layer of the HBT 1112. However, the layer 1126 has been etched to reduce its thickness to be less than the base layer of the HBT 1112. Diode contacts are deposited and defined in connection with the layer 1122 and the layer 1126 as shown. As with the Schottky diode 154 above, the PIN diode 1114 has been separated from the HBT 1112 in a convenient manner so as to provide an additional integrated device than the two device circuit as discussed above with reference to FIG. 9.

FIG. 13 shows a side profile view of a monolithically integrated device 1130 that could also have been fabricated by the process as discussed above with reference to FIG. 9. The integrated device 1130 includes a PIN diode 1132 and an HEMT 1134 formed on a common substrate 1136. The HEMT 1134 is the same as the HEMT 156, discussed above, and thus, the different layers of the HEMT 1134 will not be discussed. The HEMT 1134 could also be an MESFET. The PIN diode 1132 shows the different device layers of a PIN diode profile. The PIN diode 1132 and the HEMT 1134 were grown on the substrate 1136 as were the device layer 118 and the profile layer 122 on the substrate 112. The PIN diode 1132 includes a heavily doped n-type GaAs contact layer 1138 grown to a thickness of about 600 nm on the substrate 1136. First diode ohmic contacts 1140 are deposited and defined on the contact layer 1138. A GaAs intrinsic layer 1142 is grown on the contact layer 1138 to a thickness of about 2000 nm. A p-type GaAs layer 1144 is grown on the intrinsic layer 1142 to a thickness of about 100 nm. A heavily doped p-type GaAs contact layer 1146 is grown on the layer 1144 to a thickness of about 50 nm. A second ohmic contact 1148 is deposited and defined on the contact layer 1146. The PIN diode 1132 is significantly different than the PIN diode 1114 that was separated from the HBT 1112. This is because the PIN diode 1114 was conveniently separated as a result of the development of the HBT 1112, but the PIN diode 1132 was generated by the more detailed selective beam epitaxy process.

FIG. 14 shows a side view of a monolithically integrated device 1156 that could have been generated by the steps discussed above with reference to FIGS. 10(a)–10(g). The integrated device 1156 includes an HBT 1158, a THz Schottky diode 1160, an HEMT 1162, and a PIN diode 1164 on a common substrate 1166. Each of these different devices shows the different layers for each particular device, and as such, the HBT 1158 could have been formed from the HBT profile layer 138, the HEMT 1162 could have been formed from the HEMT profile layer 144 and the PIN diode 1164 could have been formed from the PIN diode profile layer 136 of FIG. 10. Because the HBT 1158 and Schottky diode 1160 combination and the HEMT 1162 of FIG. 14 are the same as the HBT 152 and the Schottky diode 154 combination and the HEMT 156 of FIG. 11, the individual layers of the HBT 1158, the Schottky diode 1160, and the HEMT 1162 will not be discussed. Likewise, because the PIN diode 1164 of FIG. 14 has the same layer configuration as the PIN diode 1132 of FIG. 13, the PIN diode 1164 also will not be discussed.

Figure 15:
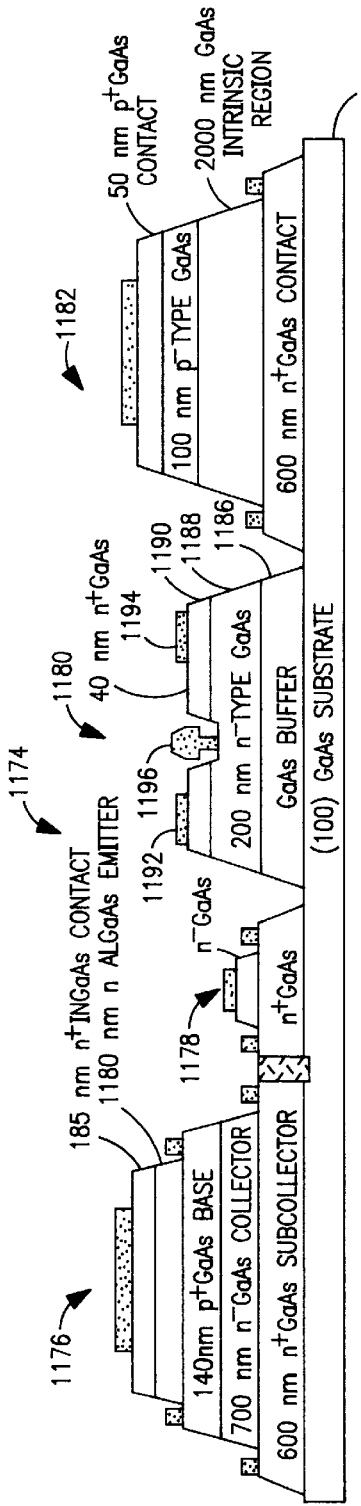
FIG. 15 shows a side view of a monolithically integrated HBT-Schottky diode-MESFET-PIN diode device that has been fabricated by a method of the present invention.

FIG. 15 shows a side view of a monolithically integrated device 1174 that could have been generated by the steps discussed above with reference to FIGS. 10(a)–10(g). The integrated device 1174 includes an HBT 1176, a THz Schottky diode 1178, an MESFET 1180, and a PIN diode 1182 formed on a common substrate 1184. The integrated device 1174 is the same as the integrated device 1156 except that the HEMT 1162 has been replaced by the MESFET 1180. Therefore, only the specific device profile of the MESFET 1180 will be described with the understanding that the other device profiles are the same as those discussed above. The MESFET 1180 includes a GaAs buffer layer 1186 deposited on the substrate 1184. An n-type GaAs layer 1188 is grown on the buffer layer 1186 to a thickness of approximately 200 nm. A heavily doped n-type GaAs layer 1190 is grown on the layer 188 to a thickness of approximately 40 nm. A source terminal 1192 and a drain terminal 1194 are deposited and defined by an electron beam lithography process on the layer 1190. The layer 1190 is etched to expose the layer 1188, and a T-gate drain terminal 1196 is deposited and etched on the layer 1188 as shown.

Figure 16:
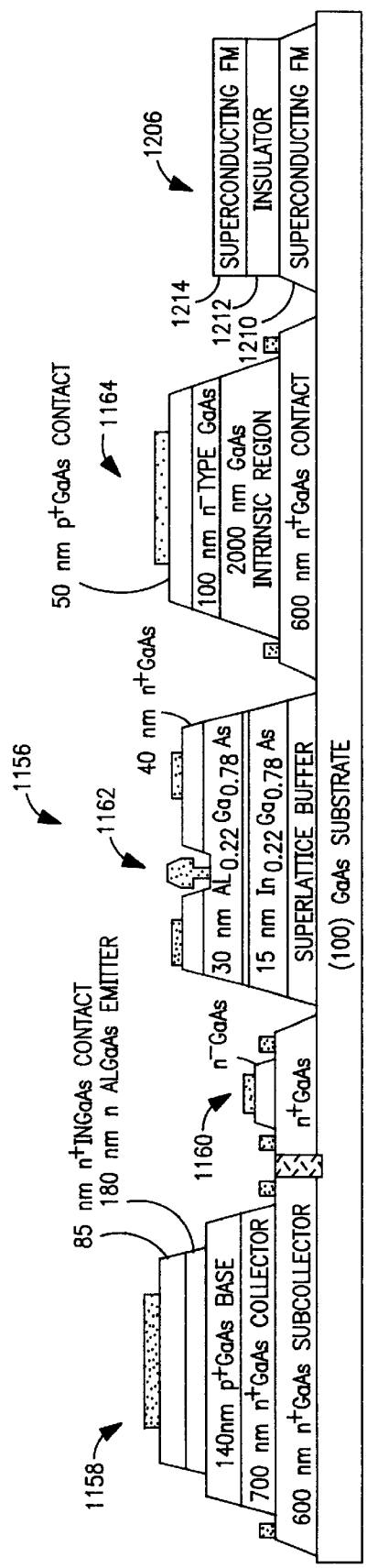
FIG. 16 shows another monolithically integrated HBT-Schottky diode-HEMT-PIN diode device that has been fabricated by a method of the present invention.

The availability of the process techniques to fabricate monolithic multifunction integrated circuits discussed above also allows the incorporation of superconducting films for microwave detection mixing and for digital applications. Superconducting films are typically deposited by sputtering, well known to those skilled in the art, but alternate deposition techniques also are available, such as by evaporation and laser ablation. Therefore, the substrate 1166 of the integrated device 1156 can also accept a superconducting-insulator-superconducting (SIS) detector 1206, as shown in FIG. 16. The SIS detector 1206 includes a bottom superconducting film 1210 deposited on the substrate 1166. An insulator layer 1212 is deposited on the superconducting film 1210. Another superconducting film layer 1214 is deposited on the insulator layer 1212. The SIS detector 1206 could also have been integrated with an HEMT only, a PIN diode-HEMT integrated device, or a PIN diode-HBT integrated device, depending on its specific application. The SIS detectors 1206 can also be replaced by superconducting transmission line or super conducting digital circuits.

Figure 17:
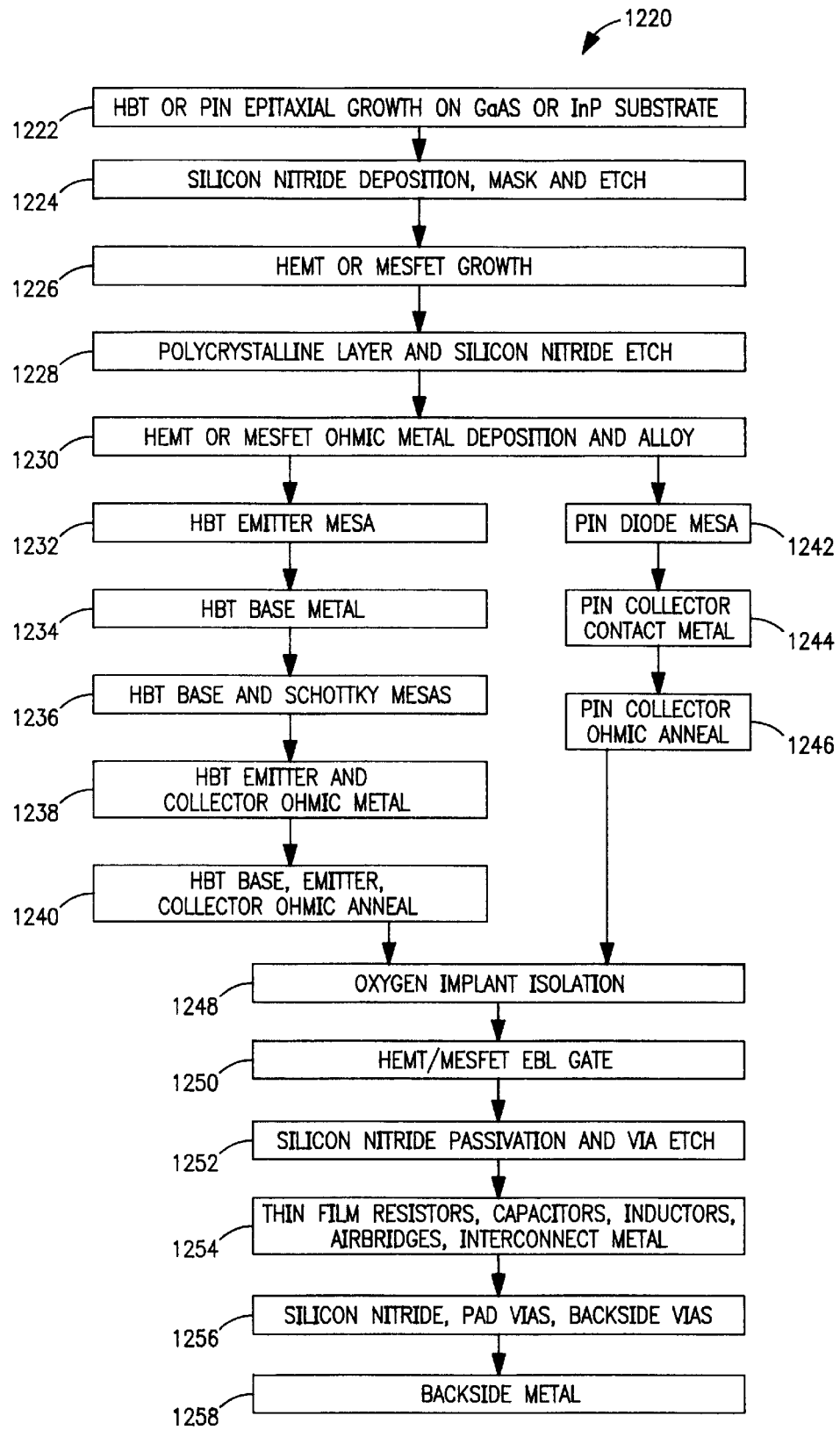
FIG. 17 shows a flow chart diagram of a method for fabricating a monolithically integrated multifunction device according to a method of the present invention.
Figure 18:
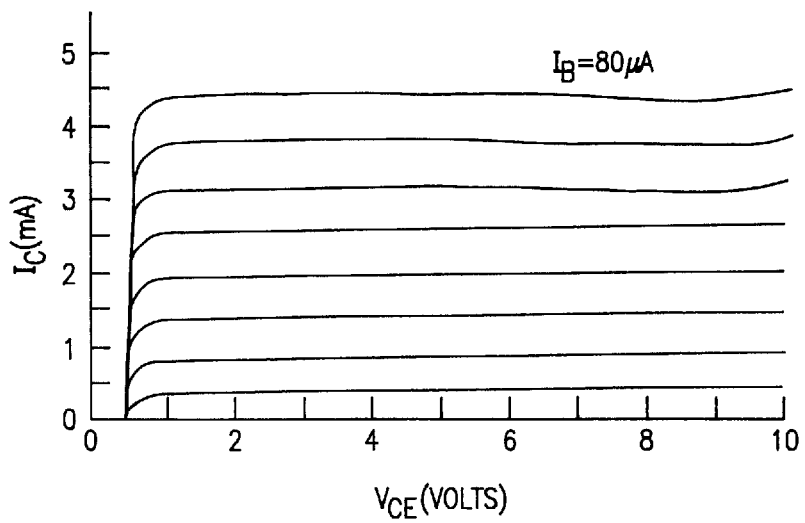
FIG. 18 is a graph showing current (I) versus voltage (V) curves of a 2×10 _m single-emitter HBT that has been fabricated by a method of forming a monolithically integrated HEMT-HBT device according to an embodiment of the present invention.

Merged process technologies have been developed to achieve all of the integrated devices discussed above. FIG. 17 shows a flow chart diagram 1220 that provides a step-by-step discussion of the formation of the monolithic integrated circuits 150, 1110 and 1130 with reference to the discussion above for FIGS. 9(a)–9(d), as well as subsequent device processing steps. Box 1222 represents the step of growing the HBT profile layer 114 or a PIN profile layer on the substrate 112. Box 1224 represents the formation of the HBT device layer 118 by the deposition, the masking and the etching steps of the silicon nitride layer 116. Box 1226 represents the growth of the single crystalline HEMT profile layer 122 and the polycrystalline HEMT profile layer 120 or the growth of a single crystalline MESFET profile layer and a polycrystalline MESFET profile layer. Box 1228 represents the etching steps of the polycrystalline layer 120 and the remaining silicon nitride layer 116.

The remaining steps of the flowchart diagram 1160 are directed to device and circuit processing steps, such as forming contacts of the individual devices and connections between the devices that taken separately are known in the art. However, because the invention includes developing monolithically integrated circuits, the combination of the individual steps or a sequence of steps in different forms may not be shown in the prior art. Box 1230 represents a step of forming the ohmic metal contacts 1102 and 1104 of the HEMT 156 or the contacts of an MESFET. HEMT or MESFET ohmic metal is evaporated over the developing HEMT or MESFET structure and is rapidly thermally annealed. The evaporated metal is then patterned to form the contacts in a manner well understood to those skilled in the art.

If an HEMT or MESFET is being fabricated integrally with the HBT 152 of FIG. 11 or the HBT of FIG. 12, then the flow diagram 1160 moves from the Box 1230 to Box 1232. The Box 1232 represents a step where the emitter mesa 174 of the HBT structure is patterned and etched. Base metal is then evaporated on the developing HBT 152 and is patterned to form the base contact 168 as represented by Box 1234. Next, the mesas that form the HBT base layer 166, the Schottky diode layers 180 and 186 and the PIN diode layers 1122, 1124 and 1126 are patterned and etched as represented by Box 1236. Ohmic metal is then evaporated on the developing HBT 152 structure and is patterned to form the collector contact 162 and the emitter contact 176 as represented by Box 1238. Next, the emitter contact 176, the base contact 168 and the collector contact 162 are annealed as represented by Box 1240.

If an HEMT or MESFET is being monolithically integrated with the PIN diode 1132, as shown in FIG. 13, then after the HEMT or MESFET metal deposition step of the Box 1230, the mesas that form PIN diode layers 1138, 1142, 1144 and 1146 are etched as represented by Box 1242. Next, the p-type ohmic contact 1148 and the n-type ohmic contact 1140 are evaporated, as represented by Box 1244. The ohmic contacts 1140 and 1148 are then thermally annealed as represented by Box 1246.

After the mesas and ohmic contacts have been formed on either the HBT 152 or the PIN diode 1112, as discussed above, the next step is device isolation by an oxygen ion implantation step as represented by 1248. For the integrated device 150, the ion implantation region 182 separates the HBT 152 from the Schottky diode 154. For the integrated device 1110, the ion implantation step separates the HBT 1112 from the PIN diode 1114. Next, the T-gate terminal 1106 of the HEMT 156 or a T-gate terminal associated with an MESFET is written by electron beam lithography (EBL) to form its shape as represented by step 1250. Next, a silicon nitride passivation layer (not shown) is deposited over the entire monolithically formed integrated circuit 150, 1110 and 1130, and vias are formed to the appropriate terminals as represented by Box 1252. Thin film resistors, capacitors, inductors, airbridges and interconnect metalization (not shown) are then defined within each HBT, HEMT, MESFET, PIN diode, and Schottky diode and between these devices as represented by Box 1254. Pad vias and backside vias (not shown) are then formed as represented by Box 1256. Finally, a backside metal planar layer (not shown) is formed over the entire integrated device 150 and 1110 as represented by Box 1258.

For the integrated circuit 1156 of FIGS. 14 and 16, and the integrated circuit 1174 of FIG. 15, after the step of the Box 1230, the HBT emitter mesa is etched as indicated by the Box 1232, and the HBT base contact and the p-type PIN diode contact of the Boxes 1234 and 1244 are performed. The HBT base layer and the Schottky diode mesas are then formed as shown by the Box 1236, and the PIN diode mesa is formed as represented by the Box 1242. Next, the HBT emitter contact and collector contact are evaporated and annealed in accordance with the Boxes 1238 and 1240. Next, the PIN diode contact is annealed in accordance with the Box 1246. The process then picks up at the Box 1248 as discussed above.

DC and microwave performance results of discrete HEMTs and HBTs fabricated using the merged HEMT-HBT process described above are equivalent to those of discrete devices fabricated using known baseline single device technology processes. FIG. 10 shows a graph of current (I) in the vertical axis and voltage (V) on the horizontal axis displaying the I–V characteristics of a 2×10 _m single-emitter HBT fabricated by the HEMT-HBT monolithic process discussed above. The HBT breakdown voltage Vceo is greater than 10 V. The early voltage is greater than 500 volts, and _ is about 56 at Ic=4.5 mA. The knee voltage is normal indicating that no additional collector resistance is induced during the selective MBE process of the invention. The base-emitter voltage Vbe=1.1539 V at 1 mA, and is typical for this device geometry at this current density. Any significant base dopant diffusion into the graded AlGaAs emitter, or any increased emitter resistance would result in an increased Vbe. The emitter specific contact resistance is 1.1×10-7 _-cm2, typical for a device of this type, and indicates that no degradation of the HBT InGaAs emitter contact during the subsequent HEMT growth. Large HBT devices with 75×75 _m2 emitters had an average _=102 at Ic=1 mA (19 A/cm2) and _=175 at Ic=40 mA (711 A/cm2), with an ideality factor for the base-emitter junction diode of n=1.03.

Figure 19:
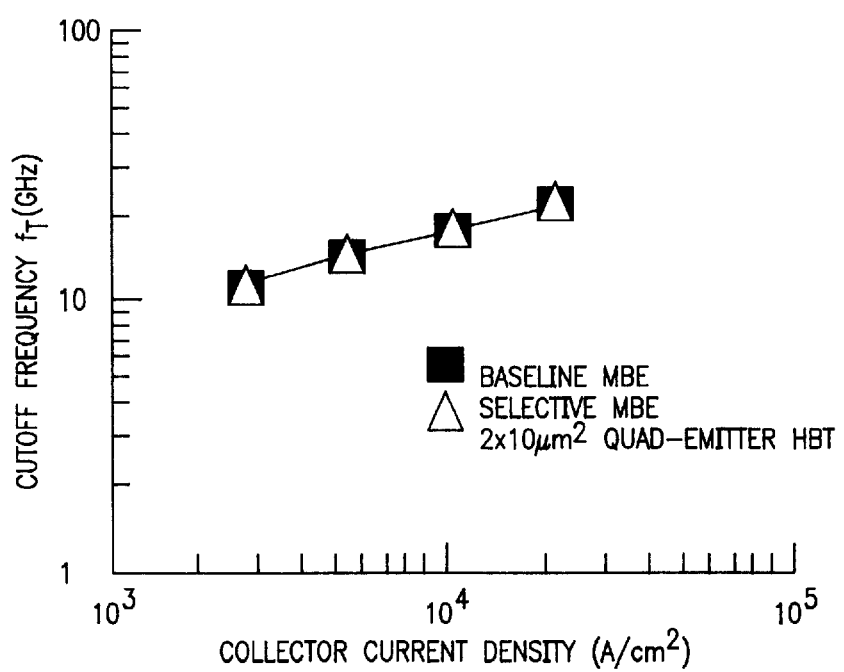
FIG. 19 is a graph of cut-off frequency (fT) versus collector current density for a 2×10 _m quad-emitter HBT fabricated by a known baseline molecular beam epitaxy fabrication method and a method of forming a monolithically integrated HEMT-HBT device according to an embodiment of the present invention.

HBT devices having a quad-emitter of 2×10 _m2 had a cut-off frequency fT=21.4 GHz and fmax=50 GHz at Ic=16 mA (2×104 A/cm2) typical for these types of devices. A plot of fT versus collector current density for baseline and selective MBE HBTs is shown in FIG. 19. The recorded values are essentially identical across the measured current range. The equivalence of dc and rf results for HBTs fabricated by baseline and selective MBE processes according to the invention indicates that no significant degradation in HBT material properties has occurred during the HEMT-HBT integration process.

Figure 20:
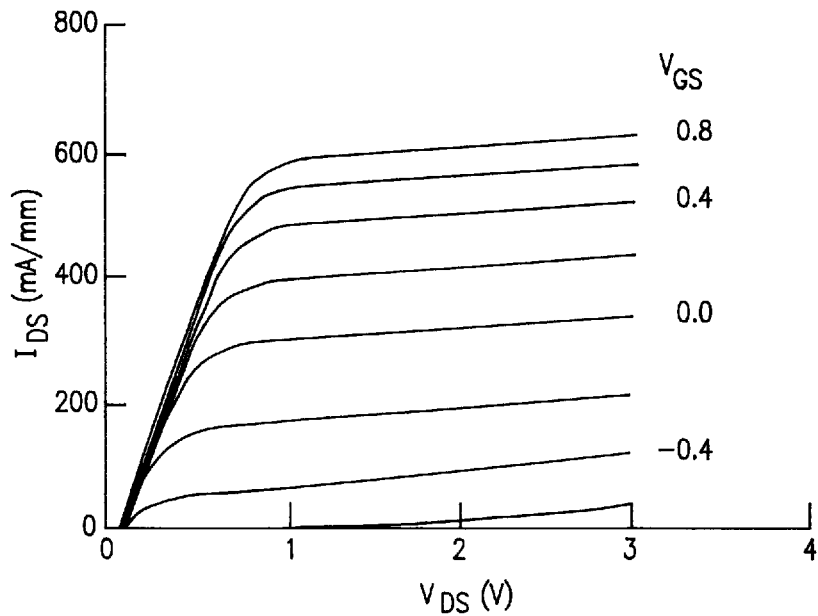
FIG. 20 shows a graph of current versus voltage curves for a T-gate HEMT that has been monolithically fabricated with an HBT according to an embodiment of the present invention.

Low-noise pseudomorphic InGaAs-GaAs 0.2 _m T-gate HEMTs fabricated monolithically with GaAs-AlGaAs HBTs have dc and rf characteristics equivalent to those of HEMTs fabricated by known baseline processes. The I–V characteristic curves for a 2-finger 80 _m gate-width HEMT device is shown in FIG. 20.

Figure 22A:
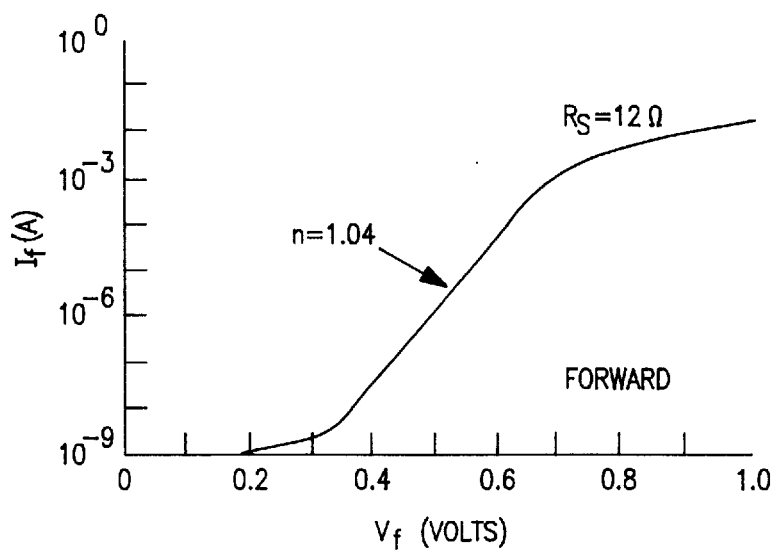
FIGS. 22(a)–22(b) show graphs of forward and reverse bias current and voltage characteristics for a PIN diode fabricated monolithically with an integrated HEMT-HBT device according to an embodiment of the present invention.
Figure 22B:
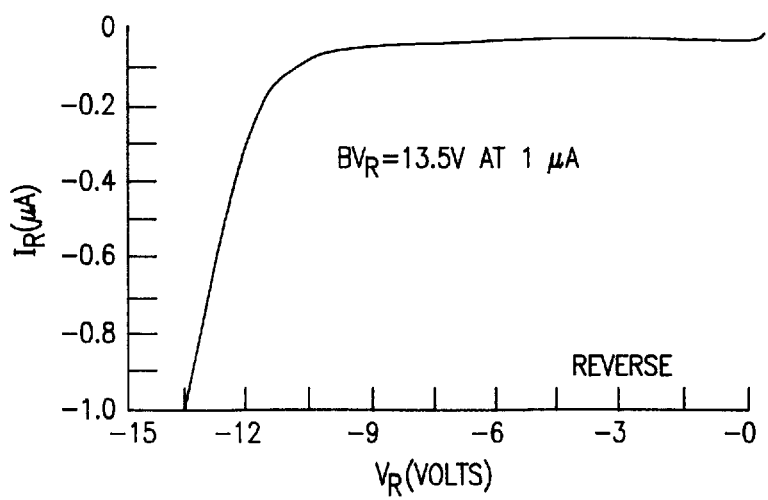

Forward and reverse I–V characteristics for the THz Schottky diode 154 fabricated from the HBT collector-subcollector region of the integrated device 150 are shown in FIGS. 22(a)–22(b). The diode ideality factor of n=1.04, series resistance of 12 _, and a breakdown voltage of approximately 13 V are typical for a Schottky diode of this type when fabricated by a known baseline HBT process.

Figure 21:
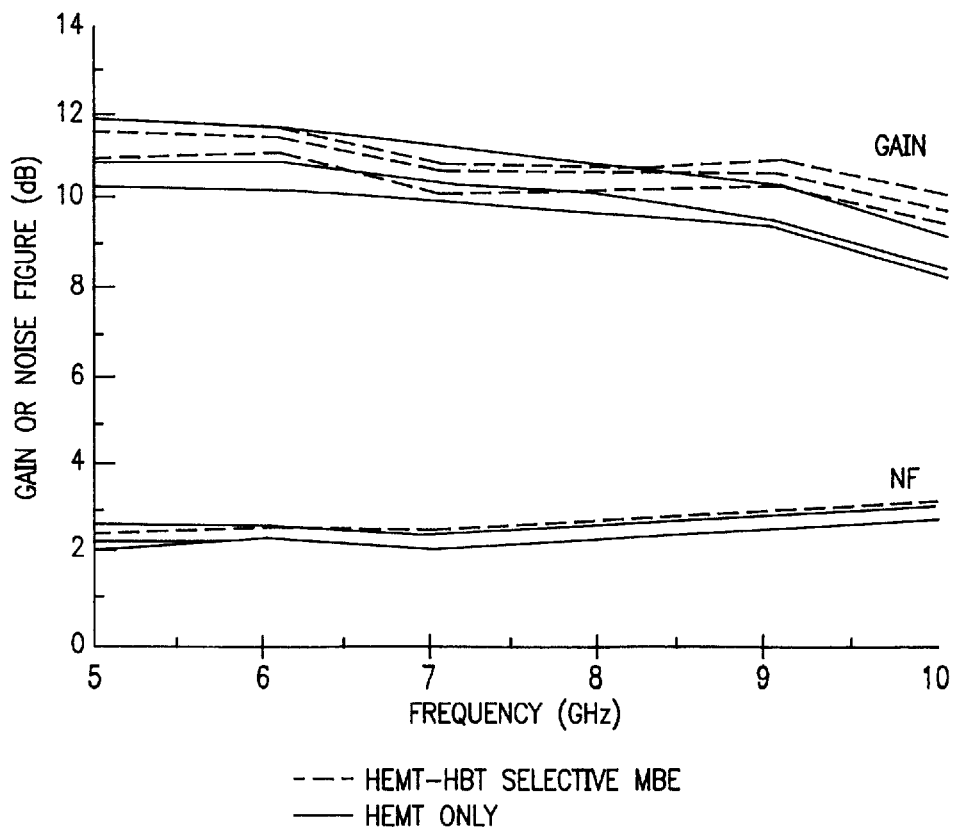
FIG. 21 shows a graph comparing gain and noise versus frequency between an HBT amplifier fabricated by a baseline technique and an HBT amplifier associated with a monolithically integrated HEMT-HBT device according to an embodiment of the present invention.

The performance of a monolithic HEMT-HBT integrated circuit device that uses active HBT regulation of an HEMT low-noise amplifier is shown in FIG. 21. The amplifier was designed for 5–10 GHz bandwidth, nominal gain greater than 10 dB, and noise figure of less than 3 dB. The HEMT low-noise amplifier is a single stage feedback design using a single 0.2 _m T-gate HEMT which is 200 _ in length. The bias current of the HEMT device can be regulated to within 5% over a threshold variation of _0.5 V using an on-chip HBT current regulator, which consumes 5 mA through a 10 V positive supply voltage. The same amplifier without the HBT regulator was fabricated in the HEMT-only technology for comparison. Gain and noise figure for amplifiers fabricated using the selective MBE process according to the present invention, and a known baseline single-technology are nearly identical as shown in FIG. 22. The HEMT amplifiers fabricated by the merged HEMT-HBT process actually have a slight gain advantage near 10 GHz. This is probably due to normal variations in the process.

Monolithic integration of HEMTs and HBTs on the same integrated circuit provides microwave circuits with performance levels unattainable using separate device generation technology. The design opportunities when using both HEMT and HBT devices on the same chip are extensive, especially when combined with THz Schottky diodes and PIN diodes. For example, the monolithic integration of microwave and digital functions can significantly improve receiver performance. Novel circuit designs, such as TTL-controlled phase shifters, low-noise high-power transmitter-receive modules, FMCW single-chip radar circuits that incorporate HBT variable control oscillators with HEMT low-noise amplifiers are all possible using monolithic integration of high-performance HEMTs and HBTs. In addition, superconducting detectors, mixers, transmission lines and digital circuits can be incorporated with MESFET, HEMT, HBT or PIN-diode circuits to increase performance to cryogenic temperatures.

FIGS. 23–26 show circuit examples of HEMT-HBT, PIN diode-HEMT and PIN diode-HBT-HEMT circuits that could gain advantages from being monolithically integrated in the manner discussed above. Each of the circuits of FIGS. 23–26 are known in the art in that hybrid or separate chip implementations have been extensively developed. With the invention as discussed above, the individual circuit components of these circuits can be monolithically integrated on a common substrate. In other words, one skilled in the art could interconnect the integrated circuits discussed above to arrive at the circuits of FIGS. 23–26. Monolithically integrated circuits of these types have heretofore not been shown in the prior art. By monolithically integrating the different circuit components on a common substrate, many advantages including, but not limited to, lower transition losses between the circuit components, less area requirements, less cost, compactness and higher performance can be realized with the monolithically integrated circuits.

Figure 23:
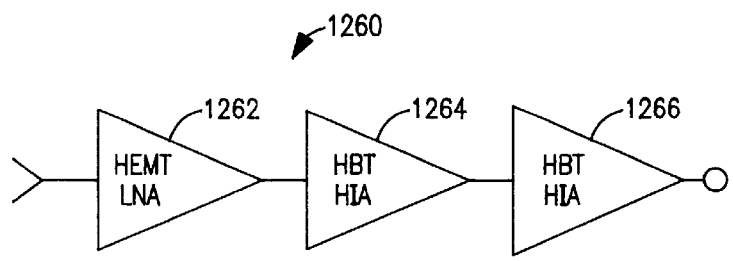
FIG. 23 shows a schematic diagram of a high performance amplifier that integrates a low-noise HEMT front end with HBT high intercept amplifiers.

FIG. 23 shows a high performance amplifier 1260, known in the art, that provides a low-noise front end, high impedance and low distortion of the third harmonic, optimum sensitivity and high power. The amplifier 1260 includes an HEMT low noise amplifier 1262 that receives an rf signal and applies an amplified output signal to first and second HBT high intercept amplifiers (HIA) 1264 and 1266. By monolithically integrating the amplifiers 1262, 1264 and 1266 on a common substrate, the known advantages of this circuit can be increased.

Figure 24:
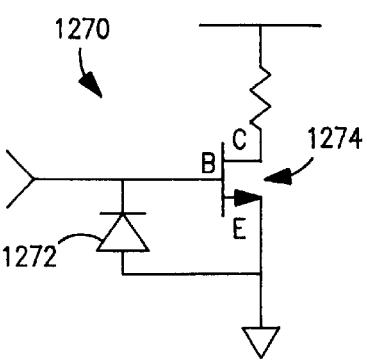
FIG. 24 shows a schematic diagram of a PIN diode limiter integrated with an HEMT low-noise amplifier.

Because HEMT amplifiers burn out readily easily at high input power, it is known in the art to provide a PIN diode limiter connected to the base (B) and emitter (E) terminals of an HEMT amplifier in order to protect the HEMT amplifier against such high input signals. FIG. 24 shows a circuit 1270 of this type of HEMT amplifier. The circuit 1270 includes a PIN diode limiter 1272 where the anode of the diode limiter 1272 is connected to the base terminal of an HEMT 1274 and the cathode of the diode limiter 1270 is connected to the emitter terminal of the HEMT amplifier 1274. The diode limiter 1272 shunts input overload signals applied to the base of the HEMT 1274 so as to protect the HEMT 1274 from signal overload and burnout. By monolithically integrating the diode limiter 1272 and the HEMT 1274 on a common substrate in the manner as discussed above, many advantages over prior art circuits of this type can be realized.

Figure 25:
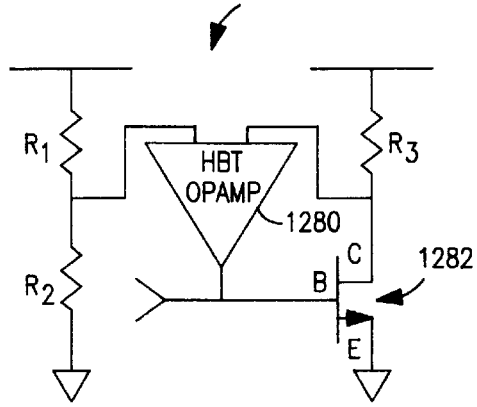
FIG. 25 shows a schematic diagram of an HBT regulator integrated with an HEMT low-noise amplifier.

FIG. 25 shows an HBT-regulated HEMT low-noise amplifier 1278. Because the characteristics of an HEMT amplifier significantly changes over time, it is known in the art to provide an HBT operational amplifier (OPAMP) in order to regulate the input signal being applied to the base terminal of the HEMT amplifier. For the amplifier 1278, input signals are applied to the input terminals of an HBT operational amplifier 1280. An output signal of the HBT operational amplifier 1280 is applied to a base terminal of an HEMT low-noise amplifier 1282 to achieve the regulation. By monolithically integrating the HBT operational amplifier 1280 and the HEMT amplifier to 1282 on a common substrate in the manner as discussed above, certain advantages, such as lower transition losses between circuit components, can be realized over the prior art HBT-regulated HEMT low-noise amplifiers.

Figure 26:
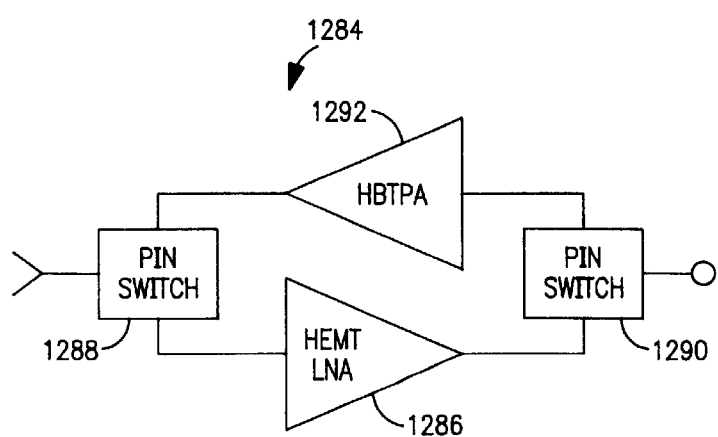
FIG. 26 is a schematic diagram of a transmit-receive module that uses an HEMT low noise amplifier for receive functions, a PIN diode switch using either an HBT base-collector PIN or a separate PIN, and an HBT power amplifier for the transmit function.

FIG. 26 shows a transmit-receive module 1284, known in the art, in a block diagram form, that uses an HEMT low-noise amplifier 1286 for the receive function, PIN diode switches 1288 and 1290, and an HBT power amplifier 1292 for the transmit function. The operation of a transmit-receive module configured in this manner is well known in the art. By monolithically integrating the HEMT amplifier 1286, the PIN-diode switches 1288 and 1290, and the HBT power amplifier 1292 on a common substrate in the manner as discussed above, certain advantages over the prior art transmit-receive modules incorporating these components can be realized.

The applications for monolithic PIN-HEMT-HBT integrated circuits and for superconducting film integration with each of the discussed technologies is not limited to the specific circuits or applications disclosed herein. The techniques disclosed are applicable to fabrication of a variety of novel microwave and optoelectronic circuits that incorporate HEMT, HBT, PIN-diode, MESFET, or superconducting films in a variety of combinations to achieve a variety of advantages not currently available with single fabrication technologies alone.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. An optically controlled oscillator comprising:
   a heterojunction bipolar transistor (HBT) having base, collector and emitter terminals; and
   an active inductor tank circuit electrically coupled to said HBT, including a high electron mobility transistor (HEMT) and a photodetector and an optical port for exciting said photodetector.

2. The optically controlled oscillator as recited in claim 1, wherein said photodetector is formed from an HEMT.

3. The optically controlled oscillator as recited in claim 1, wherein said photodetector is formed from a PIN diode.

4. The optically controlled oscillator as recited in claim 1, wherein said HBT is connected in a common collector configuration.

5. The optically controlled oscillator as recited in claim 1, wherein said oscillator includes a bias current source and an output coupling capacitor.

6. The optically controlled oscillator as recited in claim 1, wherein said active inductor tank circuit includes one or more tuning ports for externally adjusting the oscillation frequency.

7. The optically controlled oscillator as recited in claim 1, wherein said active inductor tank circuit includes a first DC tuning port for adjusting the quiescent bias of said active inductor.

8. The optically controlled oscillator as recited in claim 1, wherein said active inductor tank circuit includes a second DC tuning port for adjusting the bias of the photodetector.

9. The optically controlled oscillator as recited in claim 5, wherein said bias current source is formed as a current mirror.

10. The optically controlled oscillator as recited in claim 5, wherein said active inductor tank circuit is formed from two HEMTs connected in cascode.

11. The optically controlled oscillator as recited in claim 1, wherein said oscillator is formed as a monolithically integrated device.

12. An optical receiver comprising:
    a heterojunction bipolar transistor (HBT) having base, collector and emitter terminals and a common source high electron mobility transistor (HEMT), connected in cascode; and
    an active inductor tank circuit coupled to the base of said HBT, said tank circuit including an HEMT and a photodetector and an optical port for exciting said photodetector.

13. The optical receiver as recited in claim 12, wherein said photodetector is formed as an HEMT.

14. The optical receiver as recited in claim 12, wherein said photodetector is formed as an PIN diode.

15. The optically controlled oscillator as recited in claim 12, wherein said active inductor tank circuit includes a first DC tuning port for adjusting the quiescent bias of said active inductor.

16. The optically controlled oscillator as recited in claim 12, wherein said active inductor tank circuit includes a second DC tuning port for adjusting the bias of the photodetector.

* * * * *